(12) United States Patent
Nakamura et al.

(10) Patent No.: US 7,486,486 B2
(45) Date of Patent: Feb. 3, 2009

(54) MAGNETIC DEVICE TO REDUCE REVERSAL CURRENT IN CURRENT-DRIVEN MAGNETIC REVERSAL AND MAGNETIC MEMORY USING SAME

(75) Inventors: Shiho Nakamura, Kanagawa-ken (JP); Shigeru Haneda, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 669 days.

(21) Appl. No.: 10/954,099

(22) Filed: Sep. 30, 2004

(65) Prior Publication Data
US 2005/0099724 A1 May 12, 2005

(30) Foreign Application Priority Data
Sep. 30, 2003 (JP) .............................. 2003-342576

(51) Int. Cl.
*G11B 5/127* (2006.01)
(52) U.S. Cl. ..................................................... 360/324
(58) Field of Classification Search ................. 360/324, 360/324.1, 324.11, 324.12; 29/603.07, 603.15
See application file for complete search history.

(56) References Cited

U.S. PATENT DOCUMENTS

| 5,695,864 | A |  | 12/1997 | Slonczewski |  |
|---|---|---|---|---|---|
| 6,124,711 | A | * | 9/2000 | Tanaka et al. | 324/252 |
| 6,221,172 | B1 | * | 4/2001 | Saito et al. | 148/108 |
| 6,285,581 | B1 | * | 9/2001 | Tehrani et al. | 365/173 |
| 6,392,849 | B2 | * | 5/2002 | Maruyama et al. | 360/314 |
| 6,469,873 | B1 | * | 10/2002 | Maruyama et al. | 360/314 |
| 6,469,926 | B1 | * | 10/2002 | Chen | 365/158 |
| 6,532,164 | B2 |  | 3/2003 | Redon et al. |  |
| 6,603,677 | B2 | * | 8/2003 | Redon et al. | 365/158 |
| 6,628,483 | B1 | * | 9/2003 | Saito et al. | 360/314 |
| 6,639,830 | B1 | * | 10/2003 | Heide | 365/158 |
| 6,714,444 | B2 | * | 3/2004 | Huai et al. | 365/171 |

(Continued)

FOREIGN PATENT DOCUMENTS

JP     09-307073     11/1997

(Continued)

OTHER PUBLICATIONS

U.S. Appl. No. 11/117,482, filed Apr. 29, 2005, Nakamura et al.

(Continued)

*Primary Examiner*—Allen T Cao
(74) *Attorney, Agent, or Firm*—Oblon, Spivak, McClelland, Maier & Neustadt, P.C.

(57) ABSTRACT

A magnetic device includes a first ferromagnetic layer in which magnetic layers and one or more nonmagnetic layers are alternately stacked, a second ferromagnetic layer having magnetization substantially fixed to a second direction, a third ferromagnetic layer provided between the first and second ferromagnetic layers and having a variable direction of magnetization, and a couple of electrodes configured to provide write current between the first and second ferromagnetic layers so that the direction of magnetization of the third ferromagnetic layer is determined depending on a direction of the current. At least one layer of the magnetic layers has magnetization substantially fixed to a first direction. Two or more layers of the magnetic layers are ferromagnetically coupled via the nonmagnetic layers. The ferromagnetic coupling has a strength such that a parallel magnetic alignment of the magnetic layers is maintained when the write current is passed.

19 Claims, 36 Drawing Sheets

U.S. PATENT DOCUMENTS

| | | | |
|---|---|---|---|
| 6,956,766 B2 * | 10/2005 | Nakamura et al. | 365/171 |
| 7,164,560 B2 * | 1/2007 | Saito et al. | 360/324.11 |
| 2001/0043447 A1 * | 11/2001 | Saito et al. | 360/324.11 |
| 2004/0141259 A1 * | 7/2004 | Saito et al. | 360/324.11 |
| 2004/0165425 A1 | 8/2004 | Nakamura et al. | |
| 2005/0088787 A1 * | 4/2005 | Takahashi et al. | 360/324.2 |
| 2005/0099724 A1 | 5/2005 | Nakamura et al. | |
| 2005/0105221 A1 * | 5/2005 | Mizuguchi | 360/324.1 |

FOREIGN PATENT DOCUMENTS

| | | |
|---|---|---|
| JP | 2005-510047 | 4/2005 |
| WO | 03/043017 | 5/2003 |

OTHER PUBLICATIONS

U.S. Appl. No. 10/954,099, filed Sep. 30, 2004, Nakamura et al.
U.S. Appl. No. 11/087,762, filed Mar. 24, 2005, Nakamura et al.

* cited by examiner

AT RECORDING
WRITING SIGNAL "0"

WRITING SIGNAL "1"

AT REPRODUCTION
  REPRODUCING SIGNAL "0"

REPRODUCING SIGNAL "1"

MAGNETIC DEVICE TO REDUCE REVERSAL CURRENT IN CURRENT-DRIVEN MAGNETIC REVERSAL AND MAGNETIC MEMORY USING SAME

CROSS-REFERENCE TO RELATED APPLICATIONS

This application is based upon and claims the benefit of priority from the prior Japanese Patent Application No. 2003-342576, filed on Sep. 30, 2003; the entire contents of which are incorporated herein by reference.

BACKGROUND OF THE INVENTION

The invention relates to a magnetic device and a magnetic memory, and in particular, to a magnetic device having recording and reproducing capability and to a magnetic memory using the same.

A conventional method of controlling the magnetization direction of magnetic material is to apply an external magnetic field. For example, in a hard disk drive, a magnetic field generated from a recording head reverses the magnetization direction of the magnetic recording medium to perform write operation. In a solid magnetic memory, electric current generated in a wire placed in the vicinity of a magnetoresistance effect device produces a current-induced magnetic field, which is applied to a cell to control the magnetization direction of the cell. These methods for controlling the magnetization direction with an external magnetic field have a long history and can be viewed as an established technology.

On the other hand, recent advances in nanotechnology have rapidly led to finer magnetic materials. This has created the need for local magnetization control at nanoscale. However, magnetic field is difficult to localize because it basically has the nature of spreading out into space. An attempt to select a bit or cell of a microscopic size for controlling its magnetization direction encounters a "crosstalk" problem of erroneously selecting a nearby bit or cell, or otherwise a great problem that a smaller source for generating magnetic field cannot generate sufficient magnetic field.

More recently, a phenomenon called "current-driven magnetization reversal" was found in which electric current passed directly through a magnetic material causes magnetization reversal (see, for example, F. J. Albert, et al., Appl. Phy. Lett. 77, p3809 (2000)). In this phenomenon, current is spin-polarized by passing through a magnetic layer. This current flow transfers the angular momentum of spin-polarized electrons to the angular momentum of magnetic material subject to magnetization reversal. This phenomenon can be used to act directly on nanoscale magnetic materials. It is thus expected that finer magnetic materials can be used for recording without crosstalk.

However, the "current-driven magnetization reversal" has a problem at present that reversal current for reversing magnetization is extremely high, as much as 10 mA to several mA. A device structure that undergoes magnetization reversal with minimum current is desired in order to prevent device breakdown due to electric current, to prevent heat generation, to reduce power consumption, and to be reasonably combined with a high-resistance layer for detecting magnetoresistance effect for reproducing signals of magnetic tunneling or other effect.

The invention has been made in view of these problems. An object of the invention is to provide a magnetic device that can reduce the reversal current in current-driven magnetic reversal, and a magnetic memory using the same.

SUMMARY OF THE INVENTION

According to an aspect of the invention, there is provided a magnetic device comprising:

a first ferromagnetic layer in which magnetic layers and one or more nonmagnetic layers are alternately stacked, at least one layer of the magnetic layers having magnetization substantially fixed to a first direction, and two or more layers of the magnetic layers being ferromagnetically coupled via the nonmagnetic layers while having easy axes of magnetization parallel to a film plane;

a second ferromagnetic layer having magnetization substantially fixed to a second direction;

a third ferromagnetic layer provided between the first ferromagnetic layer and the second ferromagnetic layer, the third ferromagnetic layer having a variable direction of magnetization;

a first intermediate layer provided between the first ferromagnetic layer and the third ferromagnetic layer;

a second intermediate layer provided between the second ferromagnetic layer and the third ferromagnetic layer; and a couple of electrodes configured to provide write current between the first and second ferromagnetic layers to cause spin-polarized electrons to act on the third ferromagnetic layer so that the direction of magnetization of the third ferromagnetic layer is determined depending on a direction of the current, the ferromagnetic coupling having a strength such that a parallel magnetic alignment of the magnetic layers is maintained when the write current is passed.

According to another aspect of the invention, there is provided a magnetic device comprising:

a first ferromagnetic layer having magnetization substantially fixed to a first direction;

a second ferromagnetic layer having magnetization substantially fixed to a second direction;

a third ferromagnetic layer provided between the first ferromagnetic layer and the second ferromagnetic layer in which magnetic layers and one or more nonmagnetic layers are alternately stacked and the magnetic layers are ferromagnetically coupled via the nonmagnetic layers while having easy axes of magnetization parallel to a film plane, the third ferromagnetic layer having a variable direction of magnetization;

a first intermediate layer provided between the first ferromagnetic layer and the third ferromagnetic layer;

a second intermediate layer provided between the second ferromagnetic layer and the third ferromagnetic layer; and a couple of electrodes configured to provide a current between the first and second ferromagnetic layers to cause spin-polarized electrons to act on the third ferromagnetic layer so that the direction of magnetization of the third ferromagnetic layer is determined depending on a direction of the current, the ferromagnetic coupling having a strength such that magnetizations of all of the magnetic layers are reversed keeping parallel magnetic direction therebetween when the write current is passed.

According to another aspect of the invention, there is provided a magnetic device comprising:

a first ferromagnetic layer in which magnetic layers and one or more nonmagnetic layers are alternately stacked, at least one layer of the magnetic layers having magnetization substantially fixed to a first direction, and two or more layers of the magnetic layers being ferromagnetically coupled via the nonmagnetic layers while having easy axes of magnetization parallel to a film plane;

a second ferromagnetic layer in which magnetic layers and one or more nonmagnetic layers are alternately stacked, at least one layer of the magnetic layers having magnetization substantially fixed to a second direction, and two or more layers of the magnetic layers being ferromagnetically coupled via the nonmagnetic layers while having easy axes of magnetization parallel to a film plane;

a third ferromagnetic layer provided between the first ferromagnetic layer and the second ferromagnetic layer, the third ferromagnetic layer having a variable direction of magnetization;

a first intermediate layer provided between the first ferromagnetic layer and the third ferromagnetic layer;

a second intermediate layer provided between the second ferromagnetic layer and the third ferromagnetic layer; and a couple of electrodes configured to provide write current between the first and second ferromagnetic layers to cause spin-polarized electrons to act on the third ferromagnetic layer so that the direction of magnetization of the third ferromagnetic layer is determined depending on a direction of the current, the ferromagnetic coupling having a strength such that magnetization of at least one of the magnetic layers is not reversed when the write current is passed.

According to another aspect of the invention, there is provided a magnetic memory comprising a memory cell in which a plurality of the magnetic devices are provided in a matrix configuration with insulator being interposed between the magnetic devices, each of the magnetic devices having:

a first ferromagnetic layer in which magnetic layers and one or more nonmagnetic layers are alternately stacked, at least one layer of the magnetic layers having magnetization substantially fixed to a first direction, and two or more layers of the magnetic layers being ferromagnetically coupled via the nonmagnetic layers while having easy axes of magnetization parallel to a film plane;

a second ferromagnetic layer having magnetization substantially fixed to a second direction;

a third ferromagnetic layer provided between the first ferromagnetic layer and the second ferromagnetic layer, the third ferromagnetic layer having a variable direction of magnetization;

a first intermediate layer provided between the first ferromagnetic layer and the third ferromagnetic layer;

a second intermediate layer provided between the second ferromagnetic layer and the third ferromagnetic layer; and a couple of electrodes configured to provide write current between the first and second ferromagnetic layers to cause spin-polarized electrons to act on the third ferromagnetic layer so that the direction of magnetization of the third ferromagnetic layer is determined depending on a direction of the current, the ferromagnetic coupling having a strength such that a parallel magnetic alignment of the magnetic layers is maintained when the write current is passed.

According to another aspect of the invention, there is provided a magnetic memory comprising a memory cell in which a plurality of the magnetic devices are provided in a matrix configuration with insulator being interposed between the magnetic devices, each of the magnetic devices having:

a first ferromagnetic layer having magnetization substantially fixed to a first direction;

a second ferromagnetic layer having magnetization substantially fixed to a second direction;

a third ferromagnetic layer provided between the first ferromagnetic layer and the second ferromagnetic layer in which magnetic layers and one or more nonmagnetic layers are alternately stacked and the magnetic layers are ferromagnetically coupled via the nonmagnetic layers while having easy axes of magnetization parallel to a film plane, the third ferromagnetic layer having a variable direction of magnetization;

a first intermediate layer provided between the first ferromagnetic layer and the third ferromagnetic layer;

a second intermediate layer provided between the second ferromagnetic layer and the third ferromagnetic layer; and a couple of electrodes configured to provide a current between the first and second ferromagnetic layers to cause spin-polarized electrons to act on the third ferromagnetic layer so that the direction of magnetization of the third ferromagnetic layer is determined depending on a direction of the current, the ferromagnetic coupling having a strength such that magnetizations of all of the magnetic layers are reversed keeping parallel magnetic direction therebetween when the write current is passed.

BRIEF DESCRIPTION OF THE DRAWINGS

The present invention will be understood more fully from the detailed description given herebelow and from the accompanying drawings of the embodiments of the invention. However, the drawings are not intended to imply limitation of the invention to a specific embodiment, but are for explanation and understanding only.

In the drawings.

DETAILED DESCRIPTION OF THE INVENTION

Embodiments of the invention will now be described with reference to the drawings.

First Embodiment

Figure 1:
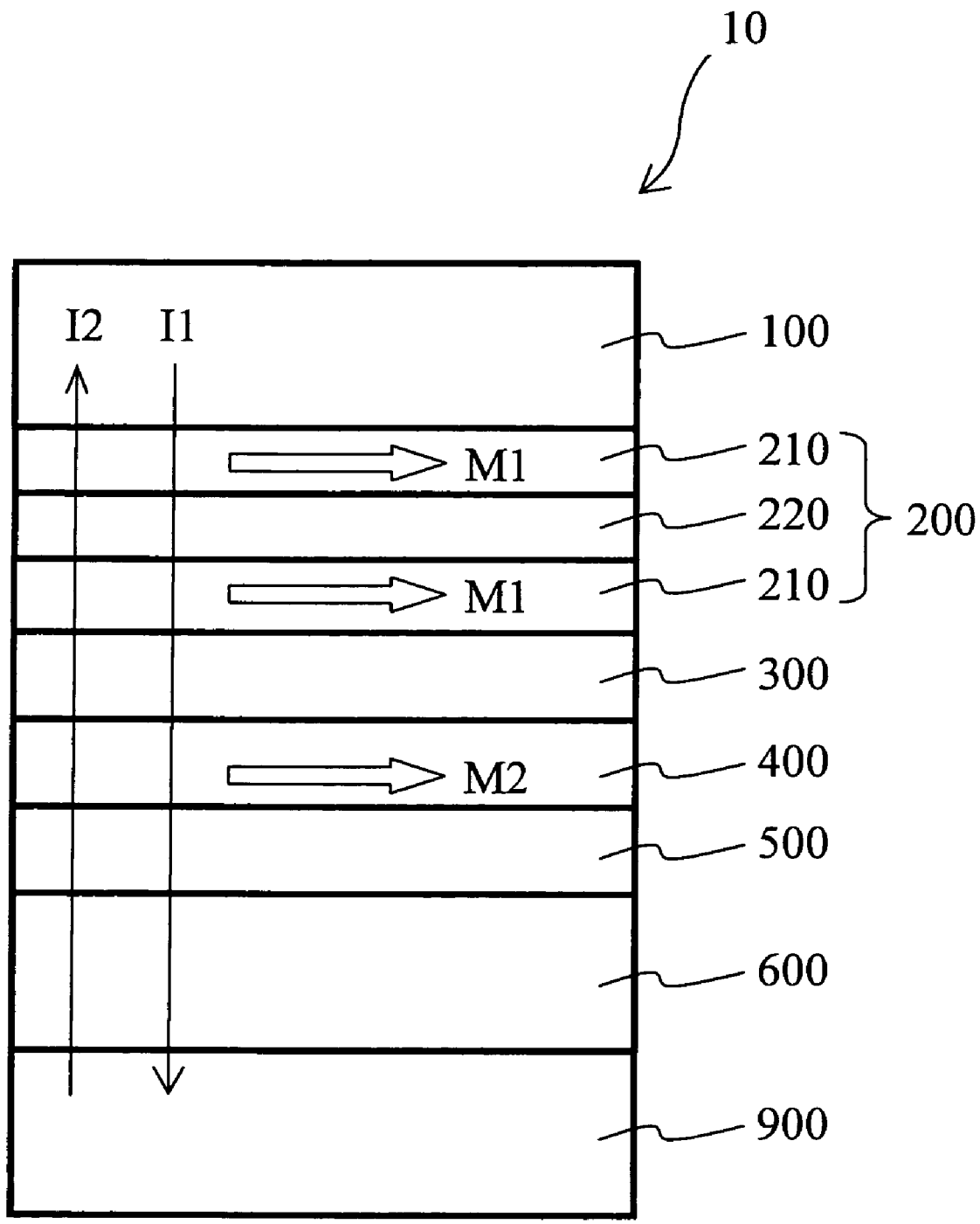
FIG. 1 is a schematic view illustrating a basic cross-sectional structure of a magnetic device according to a first embodiment of the invention.

FIG. 1 is a schematic view illustrating a basic cross-sectional structure of a magnetic device according to a first embodiment of the invention. The magnetic device 10 is configured such that a first pinned layer 200, first intermediate layer 300, free layer 400, second intermediate layer 500 and second pinned layer 600 are stacked between a couple of electrodes 100 and 900 configured to provide write current between the first and second ferromagnetic layers to cause spin-polarized electrons to act on the third ferromagnetic layer so that the direction of magnetization of the third ferromagnetic layer is determined depending on a direction of the current.

The first pinned layer 200 comprises a multilayer film in which at least two magnetic layers are ferromagnetically coupled with each other. Each of these magnetic layers has an easy axis of magnetization substantially parallel to the film plane. The multilayer film is composed of (magnetic layer 210/nonmagnetic layer 220)×N/magnetic layer 210 (N=1 or greater). That is, the first pinned layer 200 is configured such that magnetic layers 210 and nonmagnetic layers 220 are stacked alternately with each other, and that at least two magnetic layers 210 are ferromagnetically coupled with each other via a nonmagnetic layer 220 having ferromagnetic coupling strength such that magnetization of at least one of the magnetic layers is not reversed when the write current is passed. In addition, magnetization M1 of the at least two magnetic layers 210 are fixed in a predetermined direction.

First, the recording mechanism in the magnetic device 10 of the present embodiment will be described.

In the present embodiment, current I1 or I2 passed between the electrodes 100 and 900 causes magnetization M1 of the first pinned layer 200 to act on magnetization M2 of the free layer 400, and thereby the direction of magnetization M2 of the free layer 400 is controlled. More specifically, write current Iw, which is higher than reversal current Ic required for reversing magnetization M2 of the free layer 400, is passed and its flow direction (polarization) is varied to change the direction of magnetization M2 of the free layer 400. In recording, "0" and "1", for example, can be assigned depending on the direction of magnetization M2 of the free layer 400.

Figure 2A:
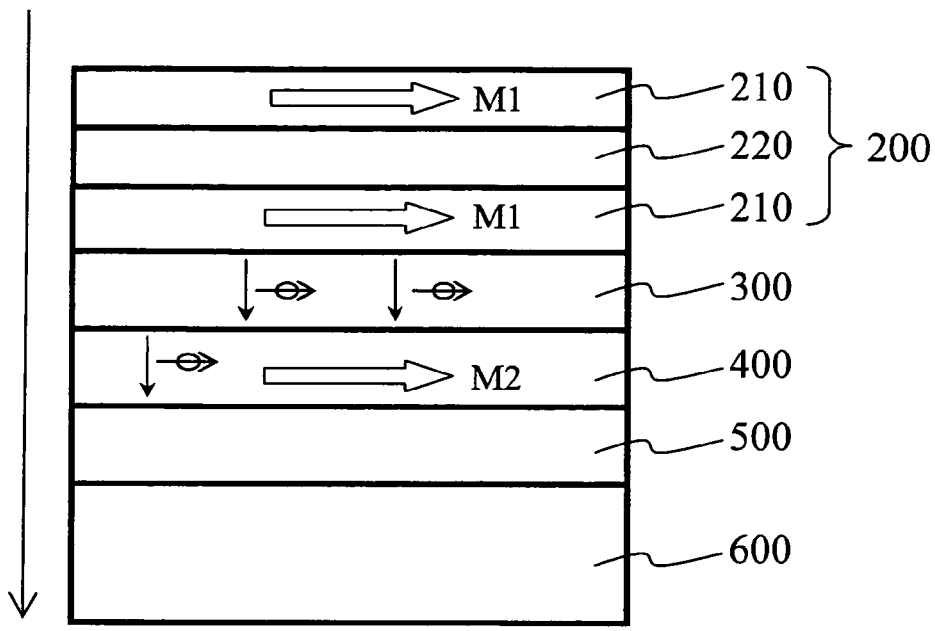
FIGS. 2A and 2B are schematic cross-sectional views for describing the recording mechanism in the magnetic device shown in FIG. 1.
Figure 2B:
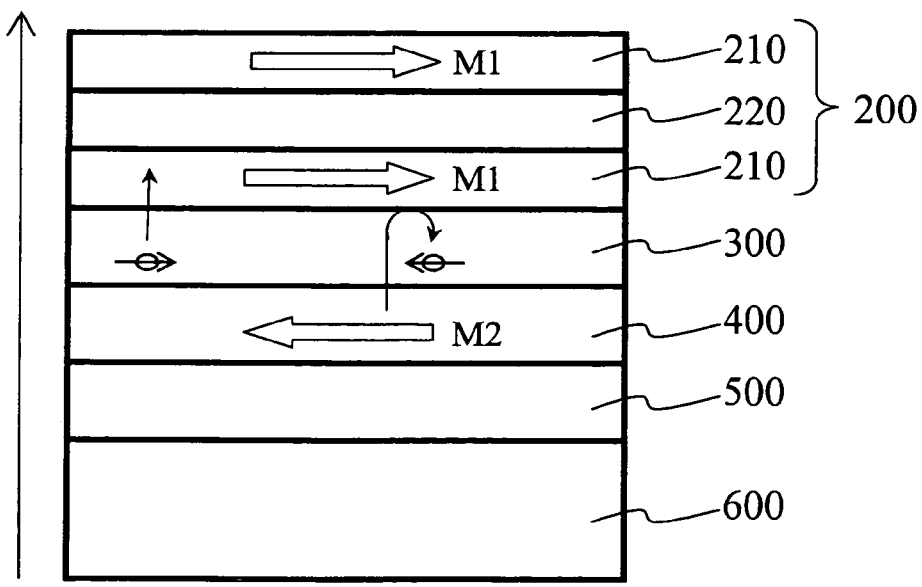

FIGS. 2A and 2B are schematic cross-sectional views for describing the recording mechanism in the magnetic device shown in FIG. 1.

As shown in FIG. 2A, when current flows from the first pinned layer 200 toward the free layer 400, magnetization M2 of the free layer 400 is directed parallel to the magnetization direction on the surface of the first pinned layer adjacent to the first intermediate layer 300. That is, electrons that have passed through the magnetic layer 210 with magnetization M1 acquire spin in the direction of magnetization M1. As these electrons flow into the free layer 400, the angular momentum carried by their spin is transferred to the free layer 400 and acts on its magnetization M2. As a result, magnetization M2 of the free layer 400 is directed parallel to magnetization M1 of the first pinned layer 200.

On the other hand, as shown in FIG. 2B, when current is passed from the free layer 400 toward the first pinned layer 200, magnetization M2 of the free layer is directed antiparallel to magnetization M1 of the first pinned layer 200 adjacent to the first intermediate layer 300. This is because, among spin electrons passing through the free layer 400, those having spin parallel to magnetization M1 of the first pinned layer pass through the first pinned layer 200, whereas those having spin antiparallel to magnetization M1 are reflected at the interface between the first pinned layer 200 and the intermediate layer 300 and again act on magnetization M2 of the free layer 400.

According to the invention, magnetization M2 of the free layer 400 can be reversed with reduced current by configuring the pinned layer 200 as a ferromagnetically coupled multilayer film.

More specifically, as shown in FIG. 2A, when current is passed from the first pinned layer 200 toward the free layer 400, the spin polarization of the electron current increases each time it passes through one of a plurality of magnetic layers 210 forming the pinned layer 200. This increases the action of the spin polarized electrons on the free layer 400. As a result, the reversal current can be reduced as compared to the case where the pinned layer is formed as a single magnetic layer. When current is passed from the free layer 400 toward the first pinned layer 200, the degree of spin polarization of the electron current reflected by the pinned layer 200 increases because of the multiple reflection in the multiplayer structure. This also increases the action of the spin polarized electrons on the free layer 400.

In the case of the magnetic device of the embodiment, it is preferable that the strength of the ferromagnetic coupling between the magnetic layers of the pinned layer is set so that the ferromagnetic coupling is kept even when the write current is passed. That is, if the strength of the ferromagnetic coupling is weak, a magnetic reversal may be exerted in at least one of the layers consisting the pinned layer. Therefore, it is necessary to keep the strength of the ferromagnetic coupling strong enough in order to prevent such a magnetic reversal.

In addition, the invention enables more efficient writing by directing magnetization M3 of the second pinned layer 600 opposite to magnetization M1 of the first pinned layer.

Figure 3A:
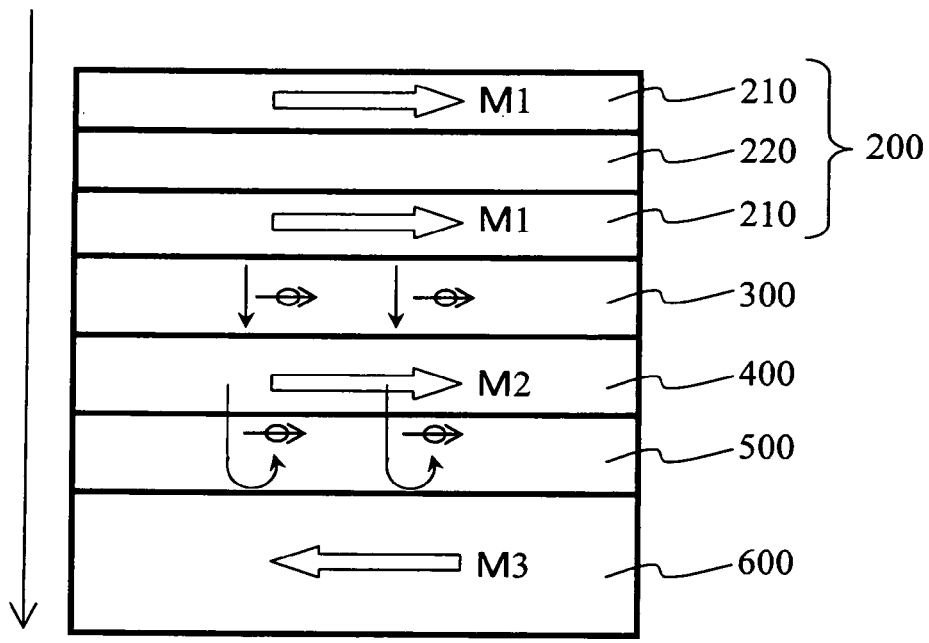
FIGS. 3A and 3B are schematic views for describing the action of magnetization in the second pinned layer 600.
Figure 3B:
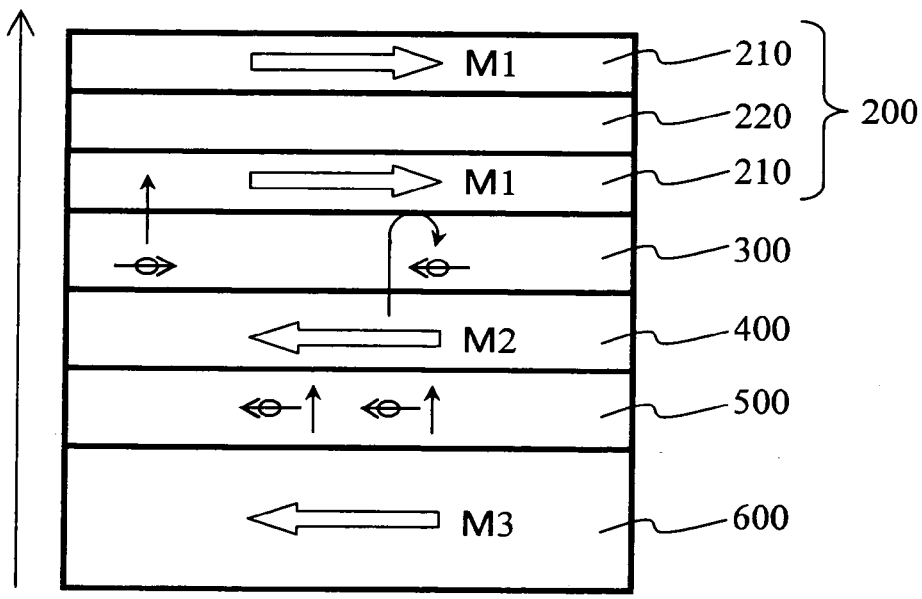

FIGS. 3A and 3B are schematic views for describing the action of magnetization in the second pinned layer 600. In these figures, the same elements as those previously described with reference to FIGS. 1, 2A and 2B are given the same reference numerals and not described in detail.

As shown in FIG. 3A, suppose that magnetization M3 of the second pinned layer is fixed in a direction opposite to magnetization M1 of the first pinned layer. When an electron current is passed from the first pinned layer 200 toward the free layer 400, electrons spin-polarized in the direction of magnetization M1 are reflected at the interface between the intermediate layer 500 and the second pinned layer 600 and again act on the free layer 400. As a result, the action of spin-polarized electrons on the free layer 400 is doubled, which further enhances the writing efficiency.

On the other hand, as shown in FIG. 3B, when an electron current is passed from the second pinned layer 600 toward the free layer 400, magnetization M3 of the second pinned layer promotes spin polarization of electrons, which acts on the free layer 400. Again, as a result, the writing efficiency can be enhanced.

Figure 4:
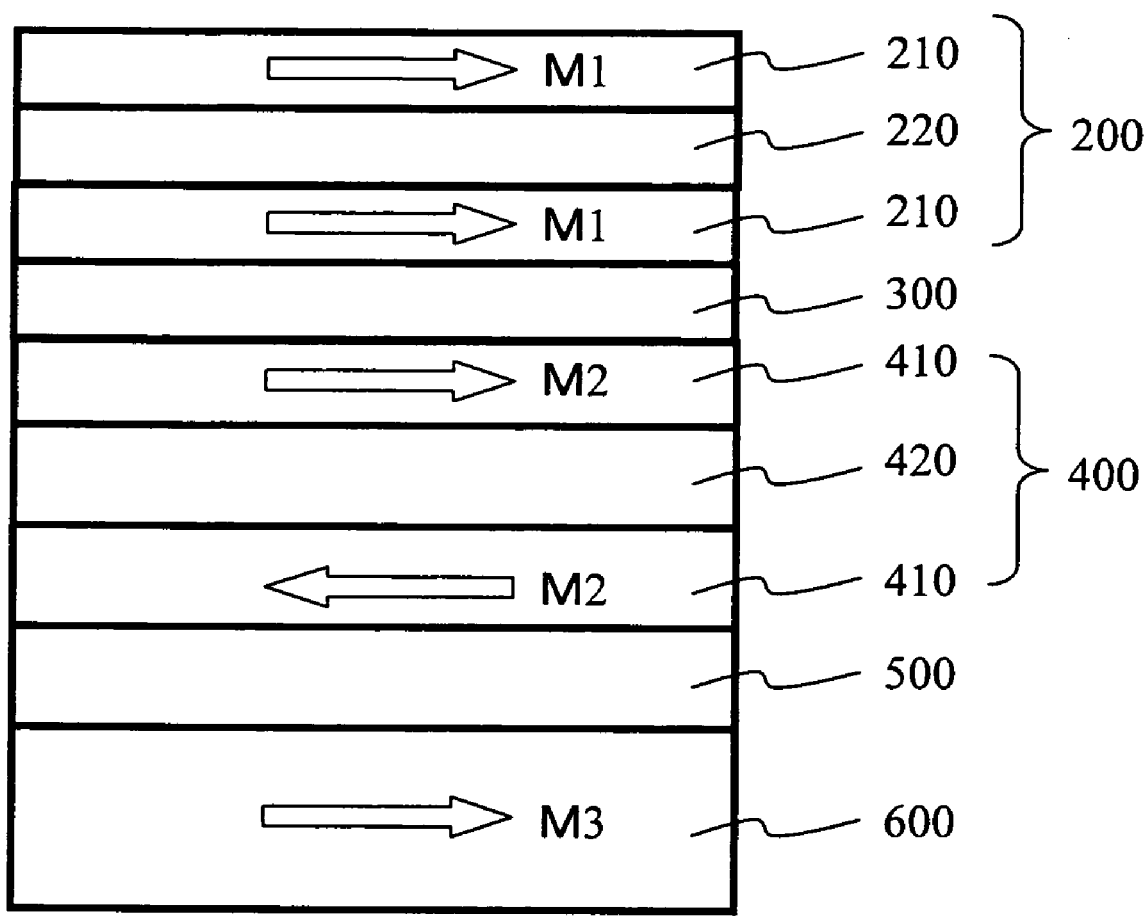
FIG. 4 is a schematic cross sectional view of a magnetic device of another example of the embodiment of the invention.

FIG. 4 is a schematic cross sectional view of a magnetic device of another example of the embodiment of the invention. In this example, the free layer 400 includes the magnetic layers 410, 410 and the non-magnetic layer 420. The magnetic layers 410, 410 are antiferromagnetically coupled via the non-magnetic layer 420. The direction of the magnetization M3 of the second pinned layer 600 is same as the direction of the magnetization M1 of the first pinned layer 200.

According to the example, the magnetization reversal can be exerted by a smaller write current compared to the case where the first pinned layer is made of a single magnetic layer.

Next, the reproducing mechanism in the magnetic device 10 of the present embodiment will be described. In the magnetic device of the present embodiment, the direction of magnetization M2 of the free layer 400 can be detected by utilizing the "magnetoresistance effect" in which electric resistance is varied with the relative direction of magnetization in different layers.

Figure 5:
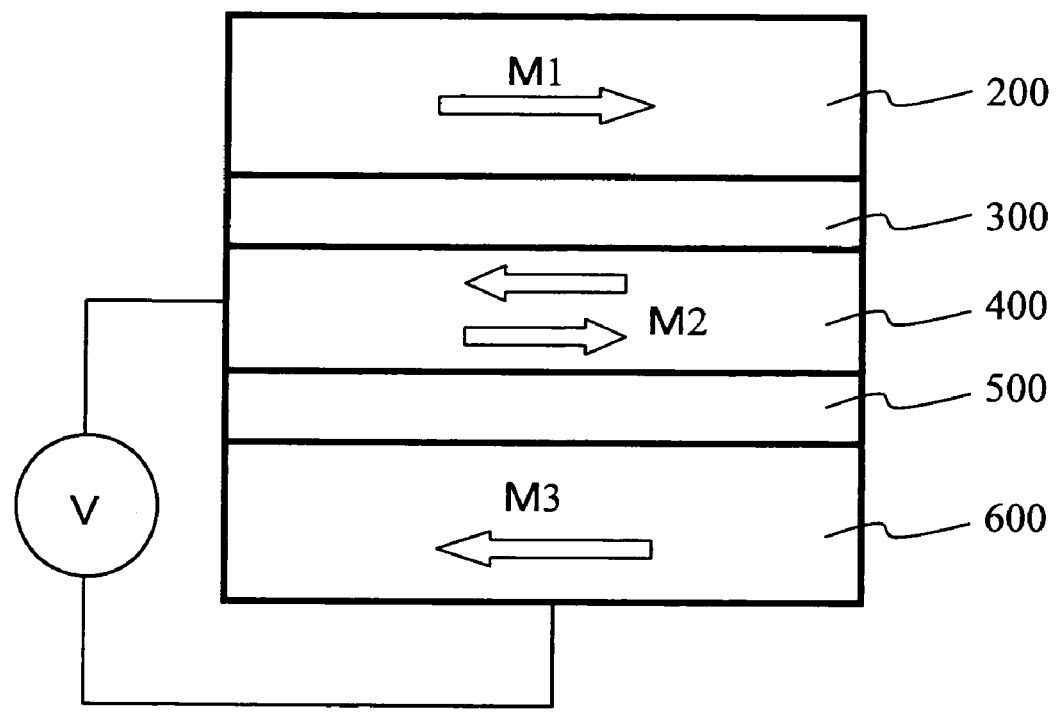
FIG. 5 is a conceptual view for describing a reading method for the magnetic device of the embodiment of the invention.

FIG. 5 is a conceptual view for describing a reading method for the magnetic device of the present embodiment. More specifically, in utilizing the magnetoresistance effect, a sense current I may be passed between either the first pinned layer 200 or the second pinned layer 600 and the free layer 400 to measure magnetoresistance.

FIG. 5 illustrates measuring magnetoresistance between the second pinned layer 600 and the free layer 400. However, on the contrary, magnetoresistance may be measured between the first pinned layer 200 and the free layer 400.

Figure 6A:
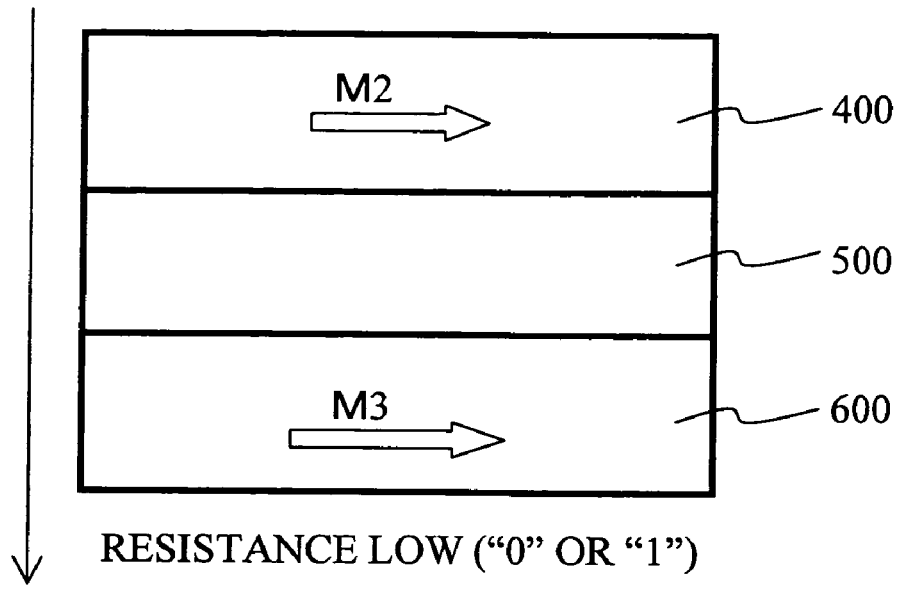
FIGS. 6A and 6B are conceptual views for describing the variation of magnetoresistance due to the relative direction of magnetization.
Figure 6B:
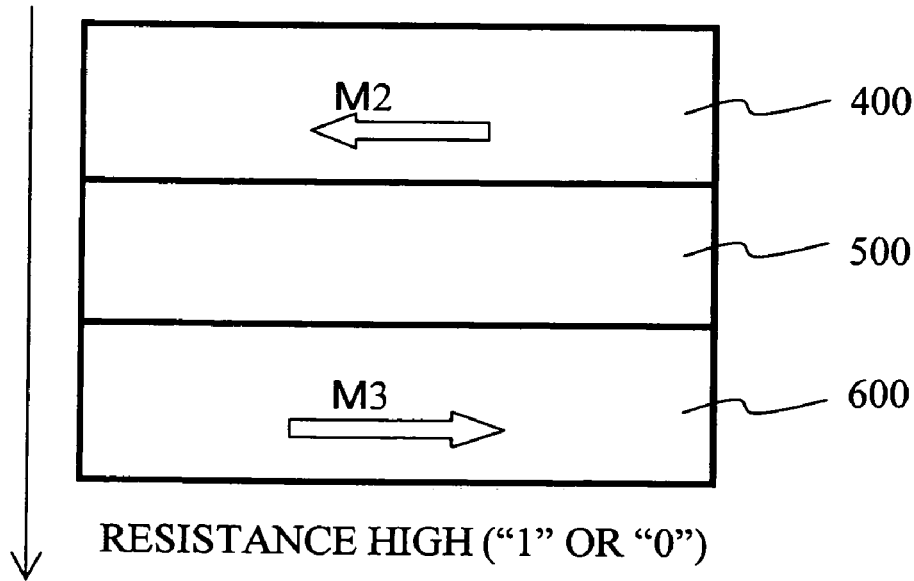

FIGS. 6A and 6B are conceptual views for describing the variation of magnetoresistance due to the relative direction of magnetization. More specifically, as shown in FIG. 6A, when magnetization M2 of the free layer 400 is directed parallel to magnetization M3 of the second pinned layer 600 (or the first pinned layer 200), a relatively small value of magnetoresistance is detected in response to sense current I passed through them.

On the other hand, as shown in FIG. 6B, when magnetization M2 of the free layer 400 is directed antiparallel to magnetization M3 of the second pinned layer 600, a relatively large value of magnetoresistance is detected in response to sense current I passed through them. These different states of resistance can be correlated with "0" and "1", respectively, to read out binary recorded data.

Alternatively, sense current can be passed via electrodes 100 and 900 at both ends of the magnetic device 10 to detect magnetoresistance. More specifically, sense current is passed between the first pinned layer 200 and the second pinned layer 600 to detect magnetoresistance. However, in the present invention, as previously described with reference to FIGS. 3A and 3B, magnetizations M1 and M3 of these pinned layers 200 and 600 are preferably antiparallel. For this reason, in a "symmetric structure", that is, if the first pinned layer 200 has the same magnitude of spin-dependent scattering as the second pinned layer 600, or if the electrons in the first pinned layer 200 have the same spin polarization acting on the free layer 400 as those in the second pinned layer 600, then the detected magnetoresistance has the same value irrespective of the direction of magnetization M2 of the free layer 400. Thus, it is necessary to adopt an "asymmetric structure".

In this respect, the present embodiment can readily achieve an "asymmetric structure" by configuring the first pinned layer 200 as a stacked structure of magnetic layers 210 and nonmagnetic layers 220, and the second pinned layer as a different structure. For example, the second pinned layer 600 may be a single magnetic layer, or a multilayer film different in structure from the first pinned layer 200.

Figure 7:
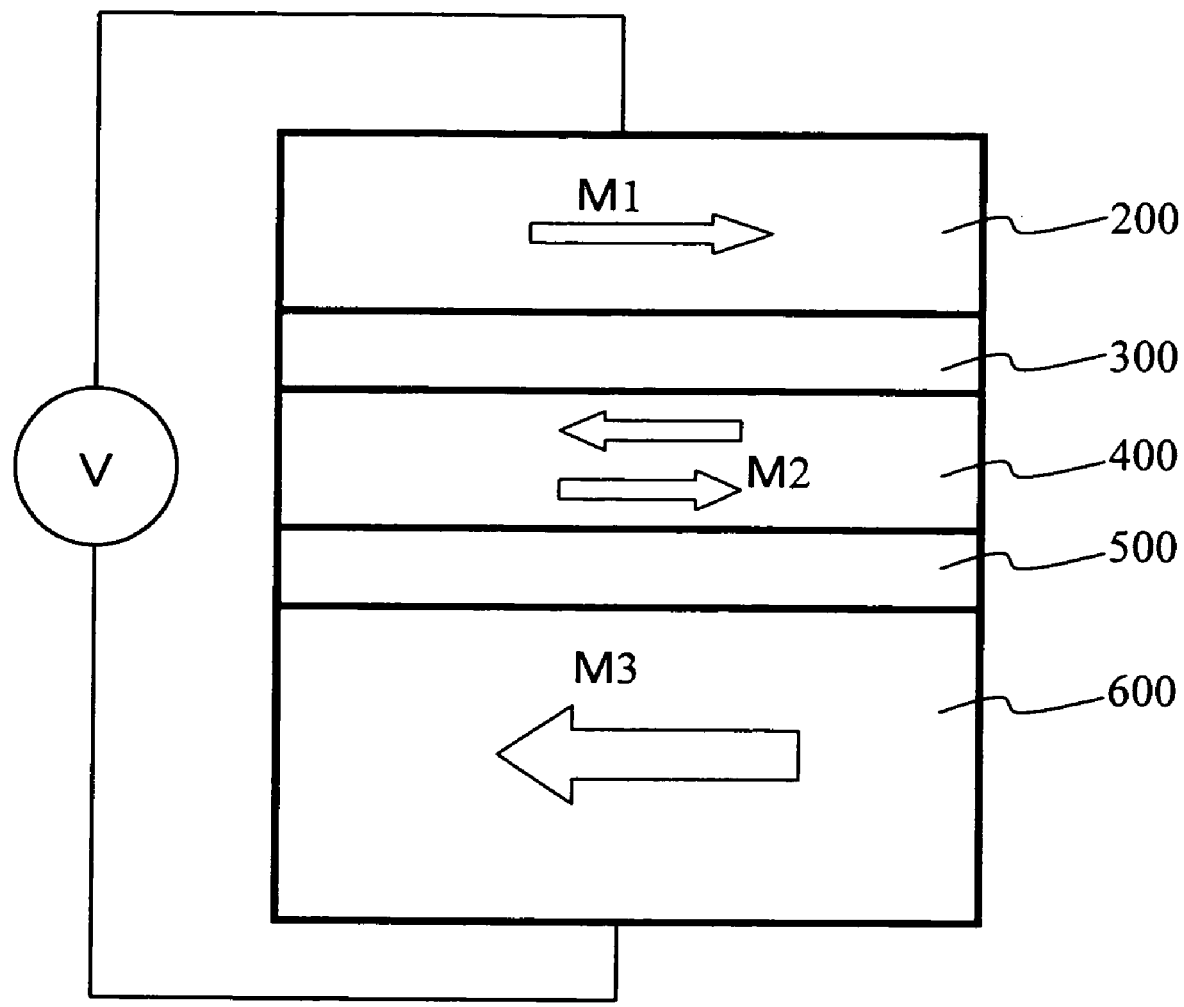
FIG. 7 is a schematic cross-sectional view showing a specific example in which the first and second pinned layers are different in structure.

FIG. 7 is a schematic cross-sectional view showing a specific example in which the first and second pinned layers are different in structure.

The first pinned layer 200 and the second pinned layer 600 can be mutually different in thickness or material to vary the magnitude of magnetizations M1 and M3. As schematically shown in FIG. 7, the thickness of the second pinned layer 600 can be greater than the effective thickness of the first pinned layer 200 to make the contribution of spin-dependent bulk scattering in the second pinned layer 600 greater than that in the first pinned layer 200. In this way, when "reading" is carried out by passing sense current I via the electrodes 100 and 900, different values of magnetoresistance are detected depending on the direction of magnetization M2 of the free layer 400.

Instead of varying the thickness of the first pinned layer 200 and the second pinned layer 600 as shown in FIG. 7, the magnitude of spin-dependent scattering in these pinned layers 200 and 600 may be varied by changing the materials of these layers.

Figure 8:
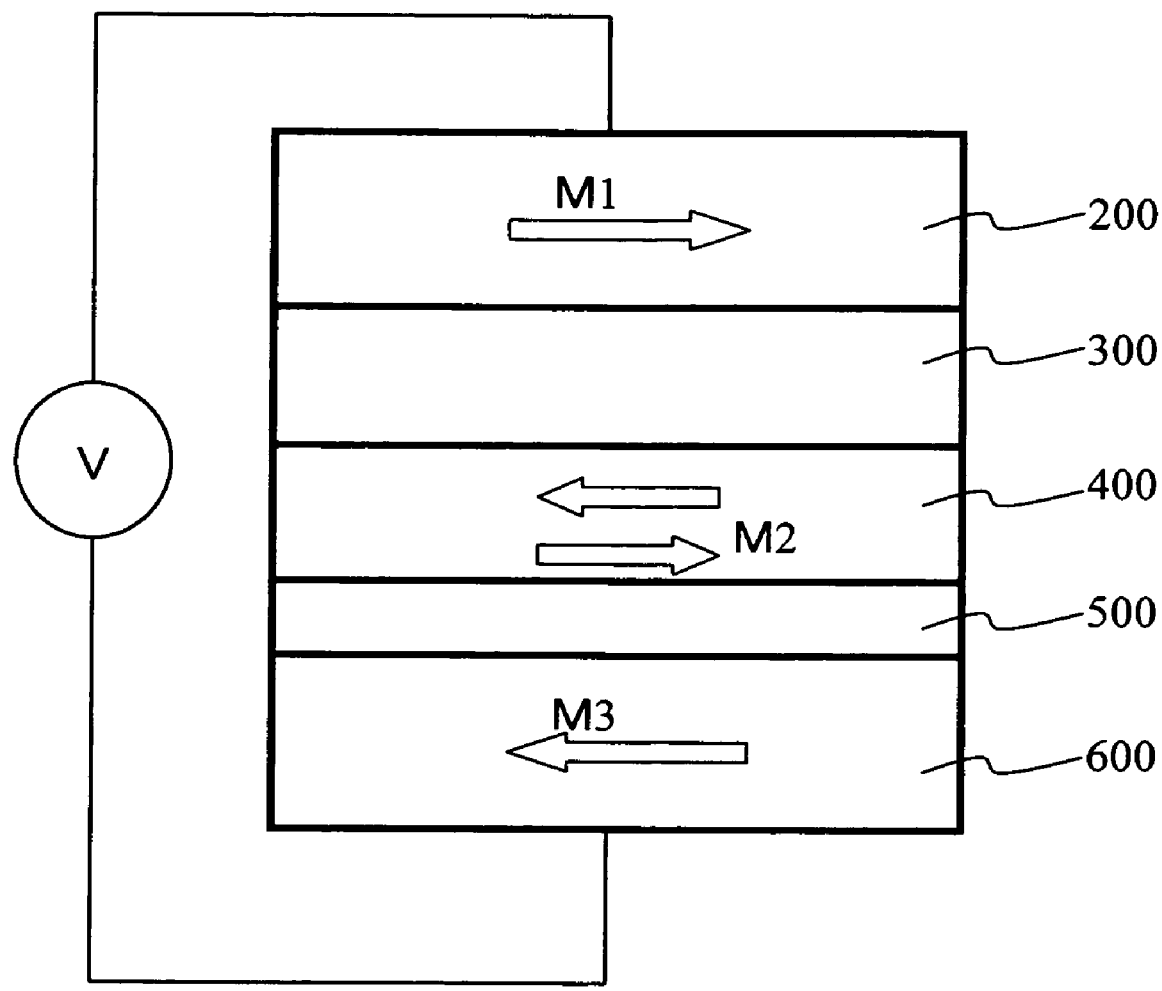
FIG. 8 is a schematic cross-sectional view showing a second specific example having an asymmetric structure.

FIG. 8 is a schematic cross-sectional view showing a second specific example having an asymmetric structure.

More specifically, in this specific example, the first and second intermediate layers 300 and 500 are different in thickness. For example, the intermediate layer 500 has a thickness with which the magnetoresistance effect is easy to detect, while the other intermediate layer 300 has a thickness with which the magnetoresistance effect is hard to detect. In this respect, preferably, the intermediate layer 500 has a thickness in the range of 0.2 to 10 nm, while the intermediate layer 300 has a thickness in the range of 3 to 50 nm.

Alternatively, the intermediate layer 500 may be formed thicker than the intermediate layer 300.

In this way, magnetoresistance effect produced between the second pinned layer 600 and the free layer 400 across the intermediate layer 500 can be primarily detected, which facilitates detecting magnetization M2 of the free layer 400.

In addition, the intermediate layers 300 and 500 may be different in electric resistance. To this end, it is effective to provide the intermediate layers 300 and 500 with different materials or compositions, or to dope one of the intermediate layers with dopant element. In this situation, the magnetoresistance effect is more clearly observed across the more resistive intermediate layer.

Especially, the intermediate layer 500 can be a tunnel barrier layer composed of insulating material while the intermediate layer 300 is made of conductor. This results in a greater magnetoresistance effect due to TMR (tunneling magnetoresistance effect). In this situation, the TMR effect produced between the free layer 400 and the second pinned layer 600 facilitates detecting magnetization M2 of the free layer 400.

Alternatively, the intermediate layer 300 can be a tunnel barrier layer composed of insulating material while the intermediate layer 500 is made of conductor.

Figure 9:
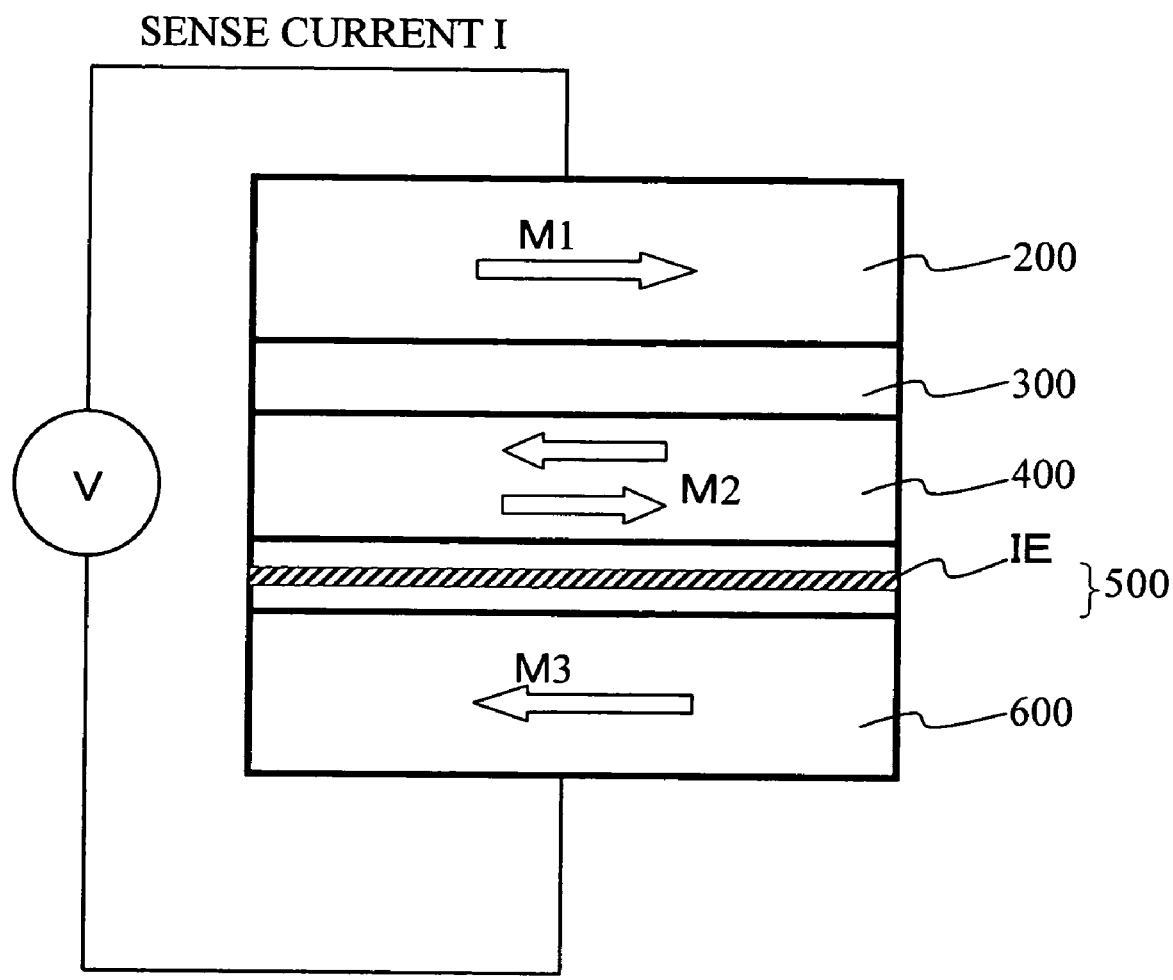
FIG. 9 is a schematic cross-sectional view showing a third specific example having an asymmetric structure.

FIG. 9 is a schematic cross-sectional view showing a third specific example having an asymmetric structure.

More specifically, in this specific example, an intermediate material layer IE is inserted into the layer 500. The intermediate material layer IE is intended to increase the magnetoresistance effect. The intermediate material layer IE may include, for example, a discontinuous, insulating thin film. More specifically, an insulating thin film having pinholes or the like can be inserted into the intermediate layer to increase the magnetoresistance effect.

Such a discontinuous, insulating thin film may comprise, for example, an oxide or nitride of an alloy of nickel (Ni) and copper (Cu), an oxide or nitride of an alloy of nickel (Ni) and gold (Au), or an oxide or nitride of an alloy of aluminum (Al) and copper (Cu).

When these oxides, nitrides and other compounds of alloys approach an equilibrium state by heating or other treatment, they are phase-separated into a phase of Au, Cu, etc. that is not susceptible to chemical combination (such as oxidation or nitridation) and hence has low electric resistance, and a phase of Ni, Al, etc. that is susceptible to oxidation or other reaction and hence has high electric resistance. For this reason, the composition and the temperature or applied energy can be controlled to form a discontinuous, insulating thin film containing pinholes. The pinholes formed like this filled with nonmagnetic material can narrow the path of current flow. This allows for controlling the contribution of spin-dependent interface scattering and bulk scattering to obtain a greater magnetoresistance effect.

When such an intermediate material layer IE is inserted into one of the intermediate layers 300 and 500, the magnetoresistance effect between the pinned layer and the free layer 400 on its both sides increases and becomes easy to detect.

Figure 10:
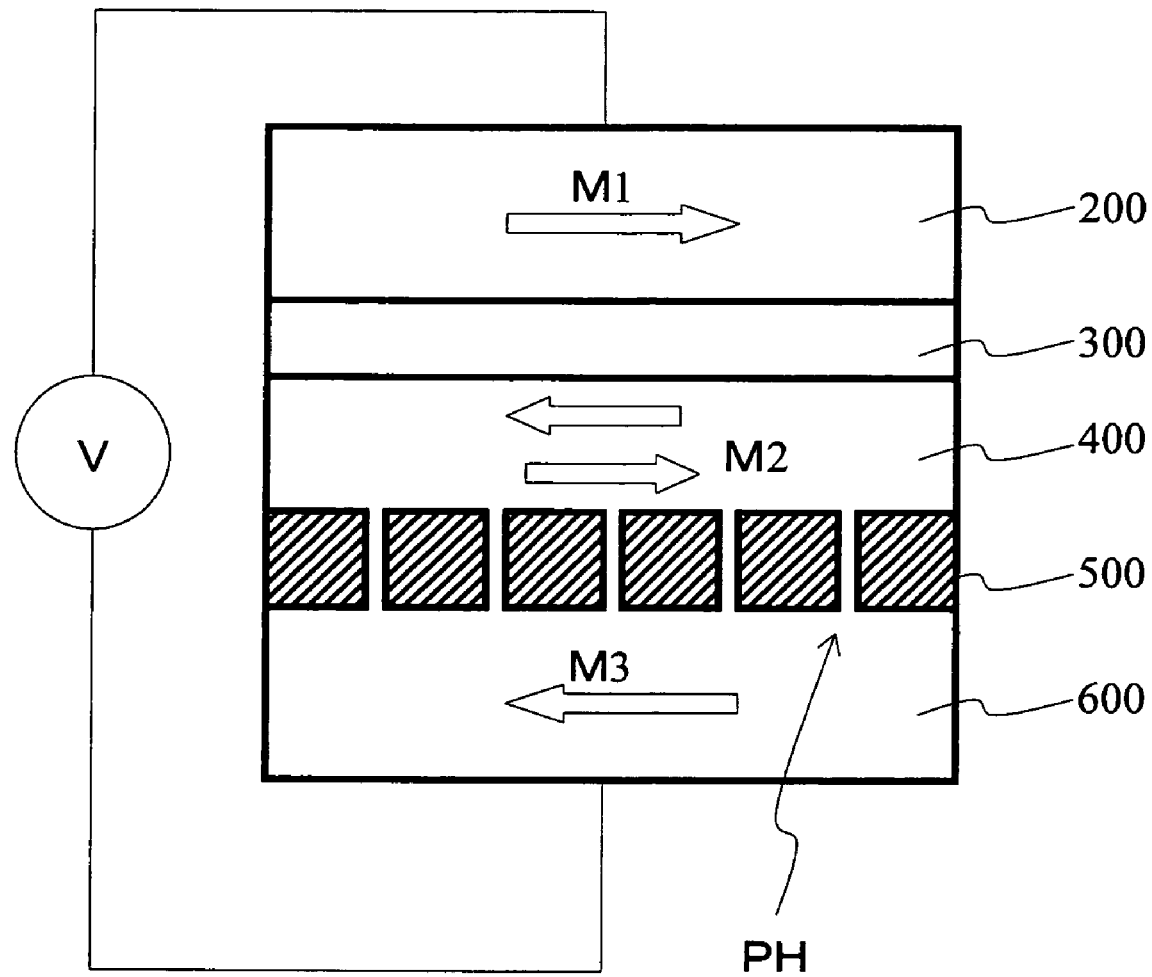
FIG. 10 is a schematic cross-sectional view showing a fourth specific example having an asymmetric structure.

FIG. 10 is a schematic cross-sectional view showing a fourth specific example having an asymmetric structure.

More specifically, in this specific example, the intermediate layer 500 is formed as an insulating layer having pinholes PH. The pinhole PH is filled with the material of at least one of the pinned layer 600 and the free layer 400 on its both sides.

When the second pinned layer 600 is connected with the free layer 400 via pinholes PH, the "BMR effect (ballistic magnetoresistance effect)" due to the so-called "magnetic point contact" is produced, which results in an extremely great magnetoresistance effect. Consequently, magnetoresistance effect produced between the magnetic layers on both sides of the pinholes PH can be detected to easily determine the direction of magnetization M2 of the free layer 400.

A preferable diameter of aperture of the pinhole PH is generally less than 20 nm. The pinhole PH can assume various shapes such as circular cones, circular cylinders, spheres, polygonal cones and polygonal cylinders. The number of pinholes PH may be one or more. However, a smaller number is preferable.

The specific examples of the asymmetric structure for easily reading out the direction of magnetization M2 of the free layer 400 using the magnetoresistance effect have been described with reference to FIGS. 7 to 10.

Figure 11A:
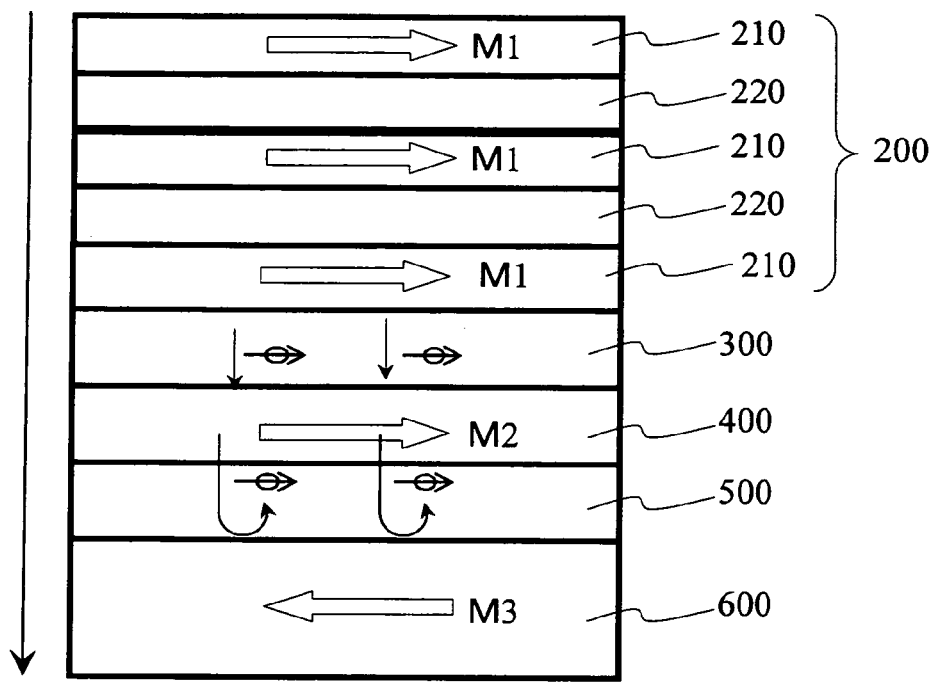
FIGS. 11A and 11B are schematic views showing a specific example in which the first pinned layer 200 has three magnetic layers 210.
Figure 11B:
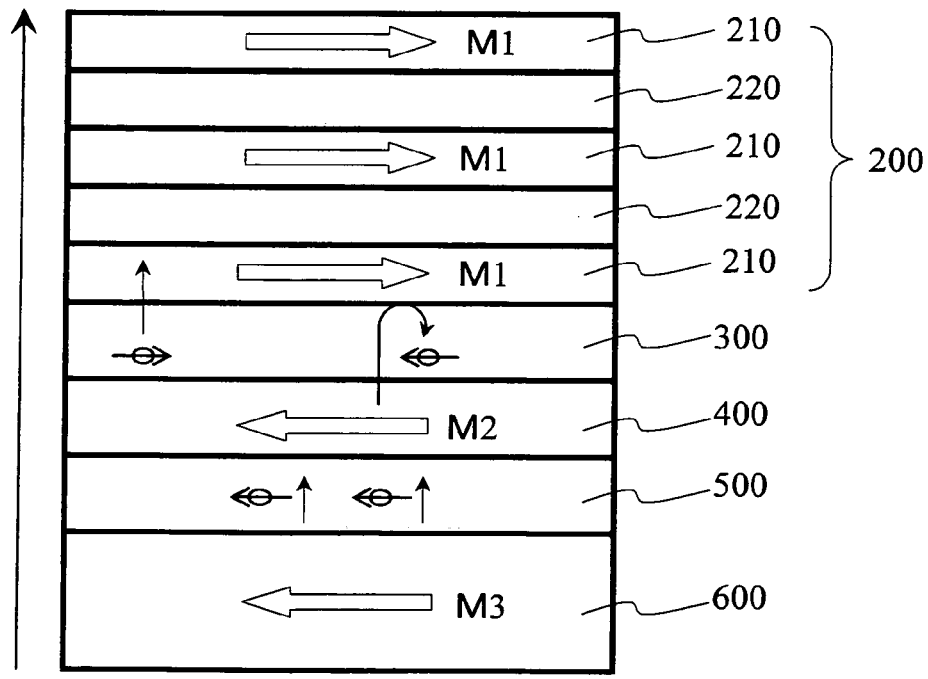

Although FIGS. 1 to 10 illustrate a situation where two magnetic layers 210 form the first pinned layer 200, the invention is not limited thereto. More specifically, as illustrated in FIGS. 11A and 11B, the first pinned layer 200 may have three magnetic layers 210. Alternatively, it may have four or more magnetic layers 210.

However, in any case, it is preferable that at least two of the magnetic layers 210 are ferromagnetically coupled. More specifically, in the present embodiment, it is preferable that the ferromagnetic coupling between the magnetic layers 210 forming the first pinned layer 200 is strong enough to maintain the ferromagnetic coupling against write current I. With a weak ferromagnetic coupling, spin-dependent reflection inside the multilayer film of the first pinned layer 200 may reverse part of magnetization M1 of the magnetic layers 210, or may disturb the distribution of magnetization. Preferably, therefore, these magnetic layers 210 are ferromagnetically coupled to avoid reversing magnetization M1 of each of the magnetic layers 210 even if the write current I flows.

To achieve such magnetic coupling, preferably, the nonmagnetic layer 220 in the multilayer film of the first pinned layer 200 is composed of one of Cu (copper), Ag (silver), Au (gold), ruthenium (Ru), iridium (Ir), rhodium (Rh) and any alloy containing them, and the nonmagnetic layer 220 has a thickness of less than 2 nm. This allows the magnetic layers 210 forming the multilayer film to effect exchange coupling between the layers, or to effect exchange coupling directly through pinholes or the like in the nonmagnetic layer 220, achieving a strong ferromagnetic coupling.

Figure 12:
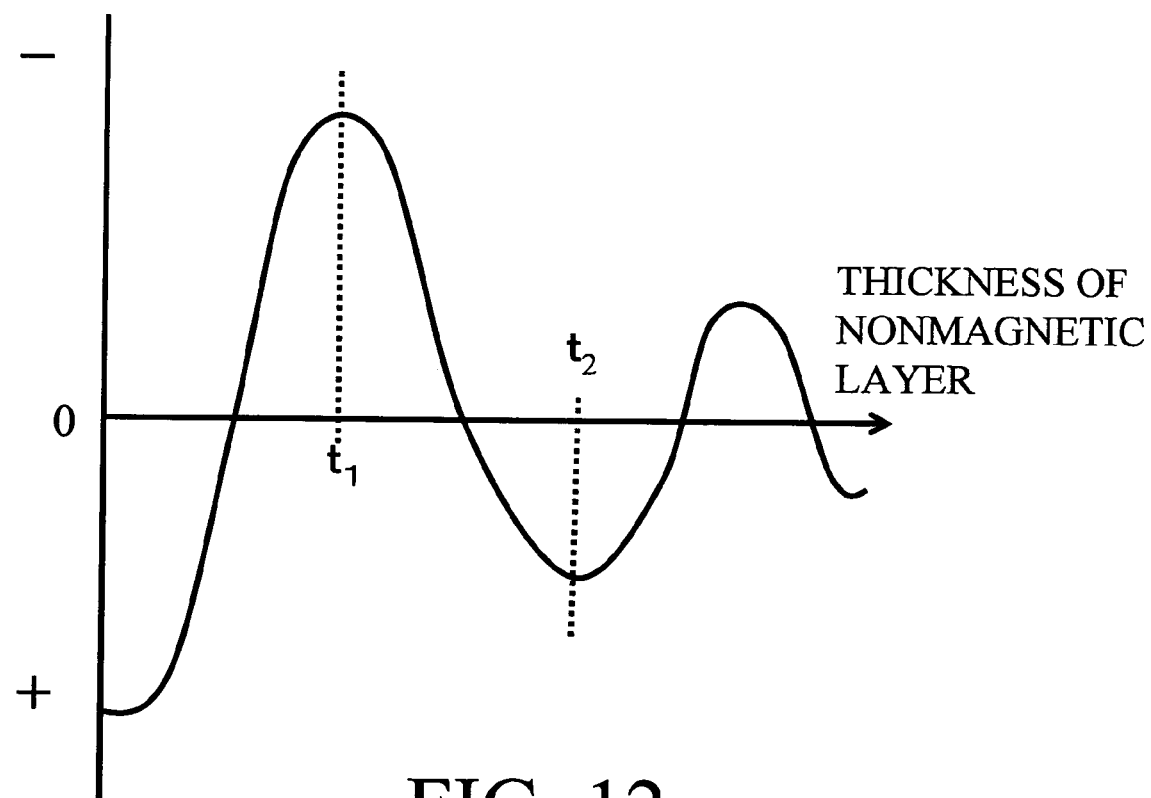
FIG. 12 is a graphical diagram showing the relation of the exchange interaction between the magnetic layers 210 versus the film thickness of the nonmagnetic layer 220.

FIG. 12 is a graphical diagram showing the relation of the exchange interaction between the magnetic layers 210 versus the film thickness of the nonmagnetic layer 220 in the case where the nonmagnetic layer 220 is made of copper (Cu). If the multilayer film forming the first pinned layer 200 has a sharp (abrupt) interface, the interlayer exchange interaction between adjacent magnetic layers 210 oscillates between positive and negative with respect to the thickness of the nonmagnetic layer 220 while being attenuated. As a result, film thickness regions suitable for ferromagnetic coupling appear in an oscillatory fashion. In the case of the above-mentioned nonmagnetic layer, the suitable film thickness is generally in the range of less than 2 nm.

On the other hand, the interface may undergo significant mixing (alloying) partly because of high energy in sputter ions at the time of film formation. In this situation, any significant oscillation as illustrated in FIG. 12 is not observed, and a strong ferromagnetic coupling is effected generally below 2 nm. The strength of the coupling is greater and more preferable for a thinner nonmagnetic layer. Magnetic layers in a direct exchange coupling through pinholes or the like has sufficiently strong exchange interaction that is locally comparable to that inside the magnetic material.

The inventors have conducted the following model calculation. Let Iw be a write current passed through a magnetic device with area A. It has been proved that the strength J of ferromagnetic coupling between the magnetic layers 210 preferably satisfies the following formula:

$$J > (hP/2e\alpha) \times (Iw/A) - t\pi Ms^2$$

where Iw/A denotes the current density, t and Ms the thickness and magnetization of a single constituent magnetic layer in the multilayer film, respectively, h the Planck's constant, P the spin asymmetry of current, e the electric charge, and α the Gilbert damping constant.

In this situation, a good ferromagnetic coupling can be maintained against the write current Iw.

In the structure of magnetic devices illustrated in FIGS. 1 to 11B, the first pinned layer 200 may have an antiferromagnetic layer (not shown) for fixing magnetization M1 of the magnetic layers 210. In addition, although FIGS. 1 to 11B represent the layers between a pair of electrodes 100 and 900 as having the same lateral size, it is not necessary that the lateral size is uniform. In particular, when the second pinned layer 600 is composed of a single magnetic layer, the lateral size of the layer can be considerably greater than the device size to avoid the influence of magnetic poles in the pinned layer 600 upon the free layer 400. This can reduce the influence of leakage magnetic field that would otherwise disturb the operation of magnetic reversal in the free layer 400.

Figure 13:
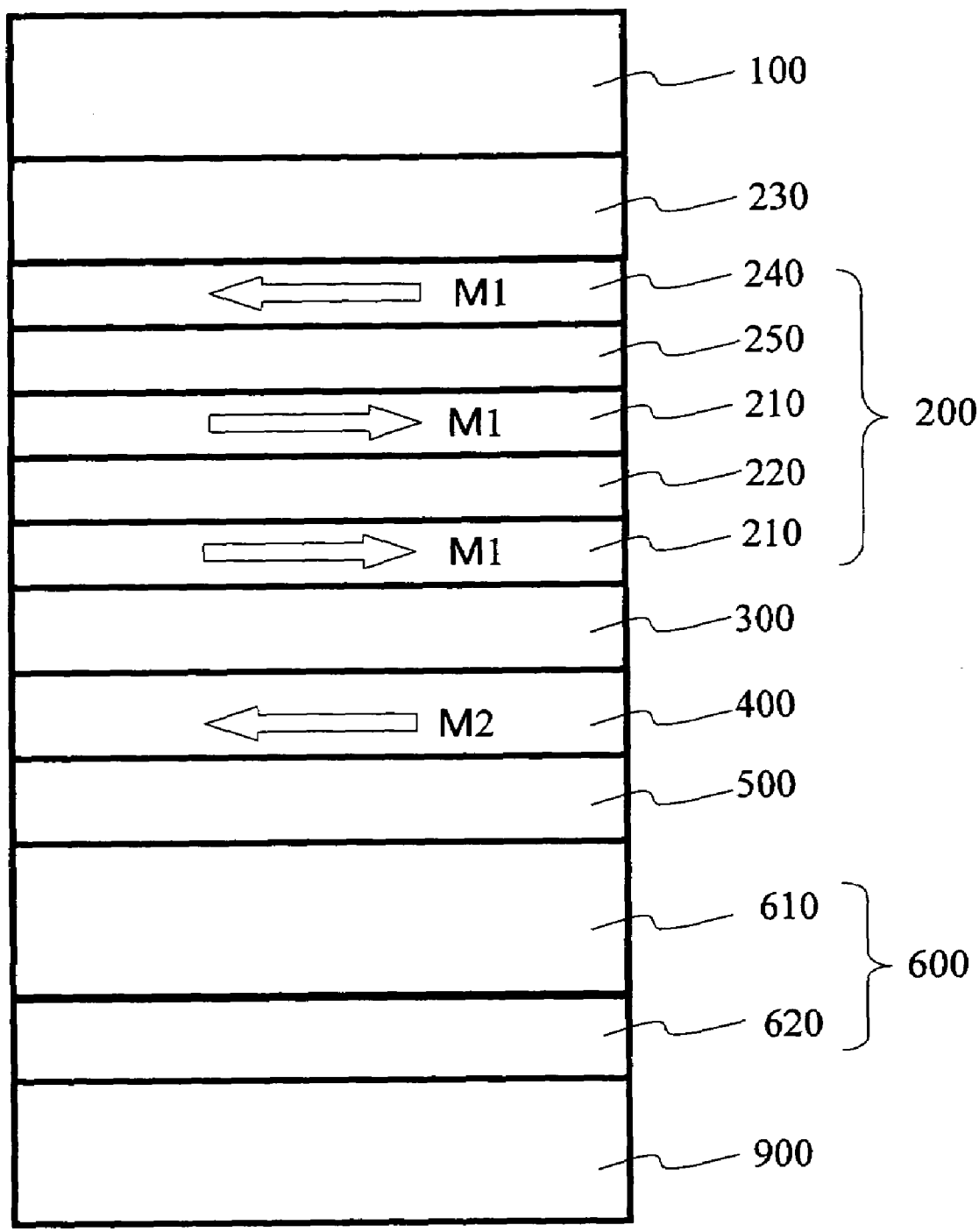
FIG. 13 is a schematic view showing a specific example in which magnetization is fixed by antiferromagnetic coupling.

FIG. 13 is a schematic view showing a specific example in which magnetization is fixed by antiferromagnetic coupling. More specifically, the magnetization of the one of the magnetic layers 240 composed of ferromagnetic material of the first pinned layer 200 is fixed by the adjacent antiferromagnetic layer 230. This magnetic layer 240 is antiferromagnetically coupled with the stacked film via a nonmagnetic layer 250 of Ru (ruthenium) or the like. In this case, the thickness of the nonmagnetic layer 250 is set so that the antiferromagnetic coupling is exerted between the magnetic layers 240.

Since such a structure cancels the magnetization direction, the leakage magnetic field from the first pinned layer 200 can be reduced. This can in turn reduce the influence of the magnetic field upon the free layer 400, and thus the controllability of writing to the free layer 400 can be enhanced. In addition, the second pinned layer 600 is provided with an antiferromagnetic layer 620, whereby the magnetization of the adjacent magnetic layer 610 composed of ferromagnetic material is fixed.

Figure 14:
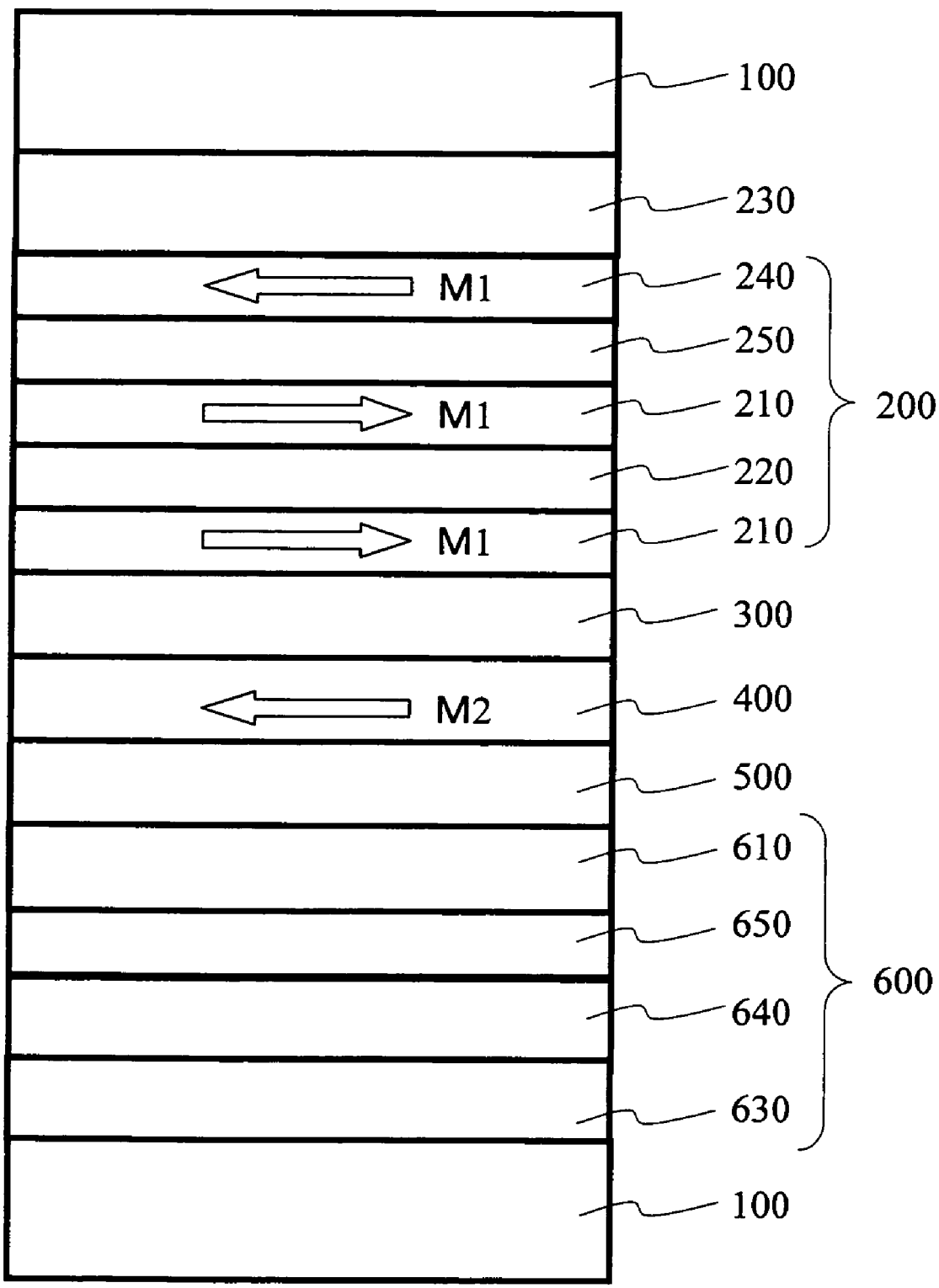
FIG. 14 is a schematic view showing a specific example in which the second pinned layer 600 is also provided with an antiferromagnetically coupled structure.

FIG. 14 is a schematic view showing a specific example in which the magnetic layers of the first pinned layer are ferromagnetically coupled, and additionally an antiferromagnetic layer is provided adjacent to this multilayer film, while the second pinned layer 600 is also provided with an antiferromagnetically coupled structure.

More specifically, the second pinned layer 600 is provided with an antiferromagnetic layer 630, whereby the magnetization of the adjacent magnetic layer 640 composed of ferromagnetic material is fixed. This magnetic layer 640 is antiferromagnetically coupled with the magnetic layer 610 via a nonmagnetic layer 650 of Ru (ruthenium) or the like. As with the specific example in FIG. 14, since the magnetization of the second pinned layer 600 is canceled, the leakage magnetic field from the second pinned layer 600 can be reduced. Again, this can in turn reduce the influence of the magnetic field upon the free layer 400, and thus the controllability of writing to the free layer 400 can be enhanced.

Second Embodiment

Next, as a second embodiment of the invention, a magnetic device will be described in which the free layer 400 is multilayered.

Figure 15:
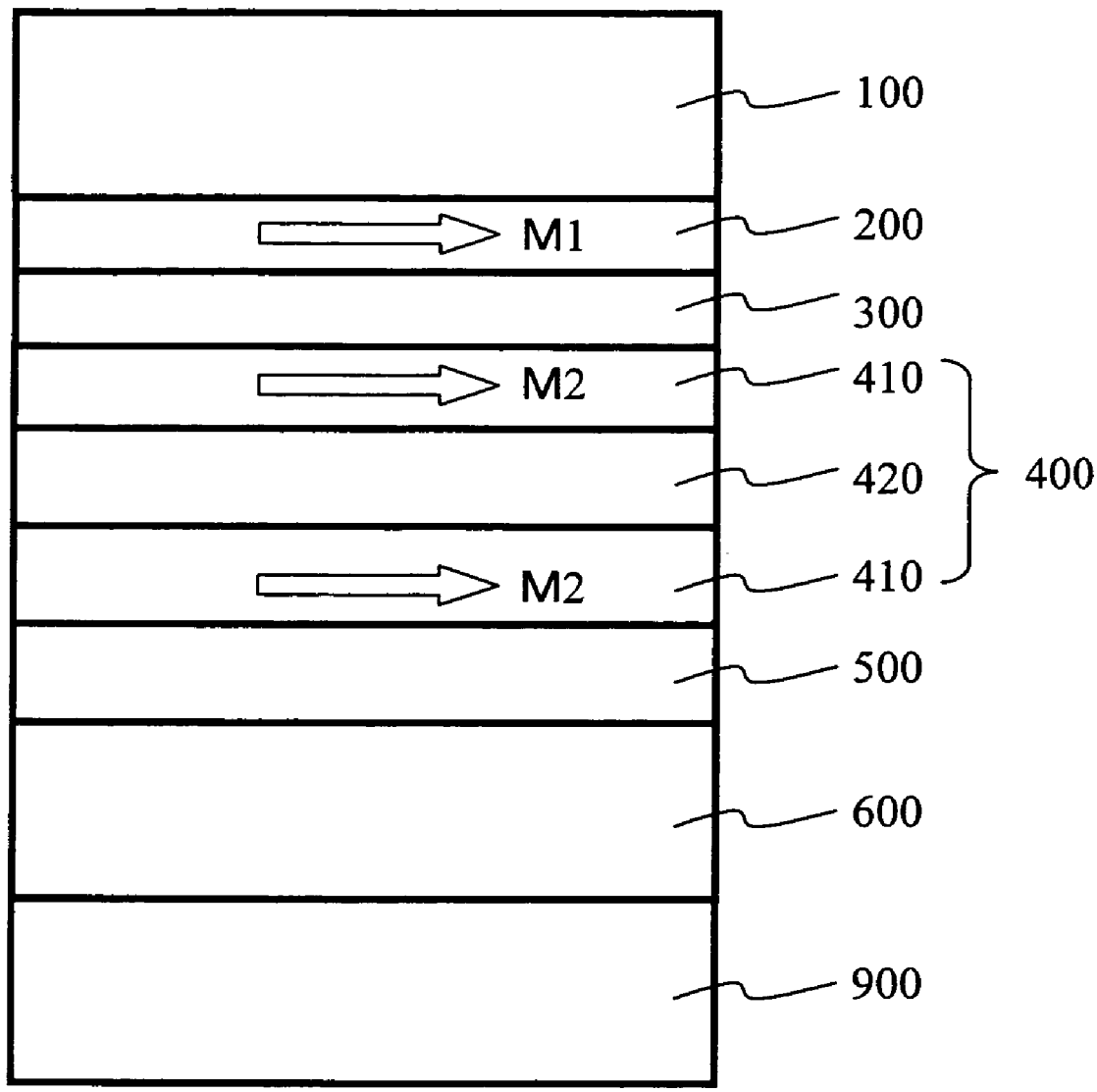
FIG. 15 is a schematic view illustrating a basic cross-sectional structure of a magnetic device according to a second embodiment of the invention.

FIG. 15 is a schematic view illustrating a basic cross-sectional structure of a magnetic device according to a second embodiment of the invention. In this figure, the same elements as those previously described with reference to FIGS. 1 to 14 are given the same reference numerals and not described in detail.

In this embodiment, the free layer 400 is configured as a multilayer film composed of (magnetic layer 410/nonmagnetic layer 420)×N/magnetic layer 410 (N=1 or greater) that are ferromagnetically coupled. That is, the free layer 400 is configured such that magnetic layers 410 and nonmagnetic layers 420 are stacked alternately with each other, and that magnetic layers 410 are ferromagnetically coupled with each other via a nonmagnetic layer 420 having a enough coupling strength such that the magnetization of the free layer 400 rotates maintaining the ferromagnetic coupling between the magnetic layers 410 when the write current is passed.

As with the first embodiment, current passed between the electrodes 100 and 900 causes the influence of magnetization M1 of the first pinned layer 200 to act on magnetization M2 of the free layer 400, and thus the direction of magnetization M2 of the free layer 400 can be controlled.

According to the present embodiment, writing with spin-polarized current can be efficiently carried out by configuring the free layer 400 as a ferromagnetically coupled multilayer film. More specifically, when current is passed from the first pinned layer 200 toward the free layer 400, spin-polarized electrons from the pinned layer 200 can act on more than one surface. This can enhance the action of the spin-polarized electrons, and increase the reversal efficiency of magnetization M2 of the free layer 400. As a result, write current can be reduced to a lower current.

On the other hand, when current is passed from the free layer 400 toward the first pinned layer 200 (when the polarity is reversed), the spin-polarization of electrons from the free layer 400 increases by the filtering effect. Thus the reversal can be carried out more efficiently, and magnetization reversal current can be reduced.

Figure 16A:
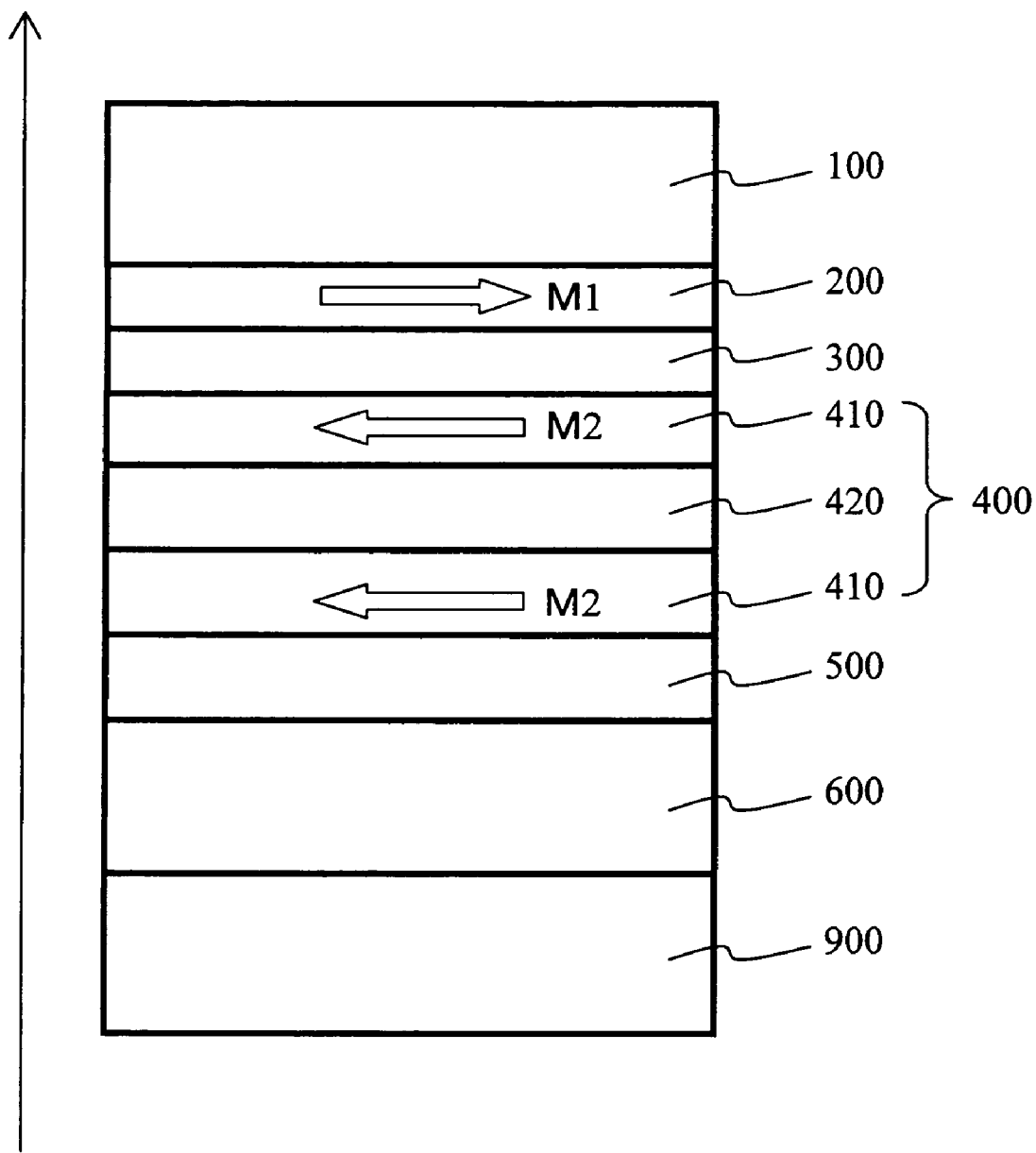
FIGS. 16A and 16B show the magnetization directions after the magnetization reversal of the free layer 400 has been exerted by the electric current I.
Figure 16B:
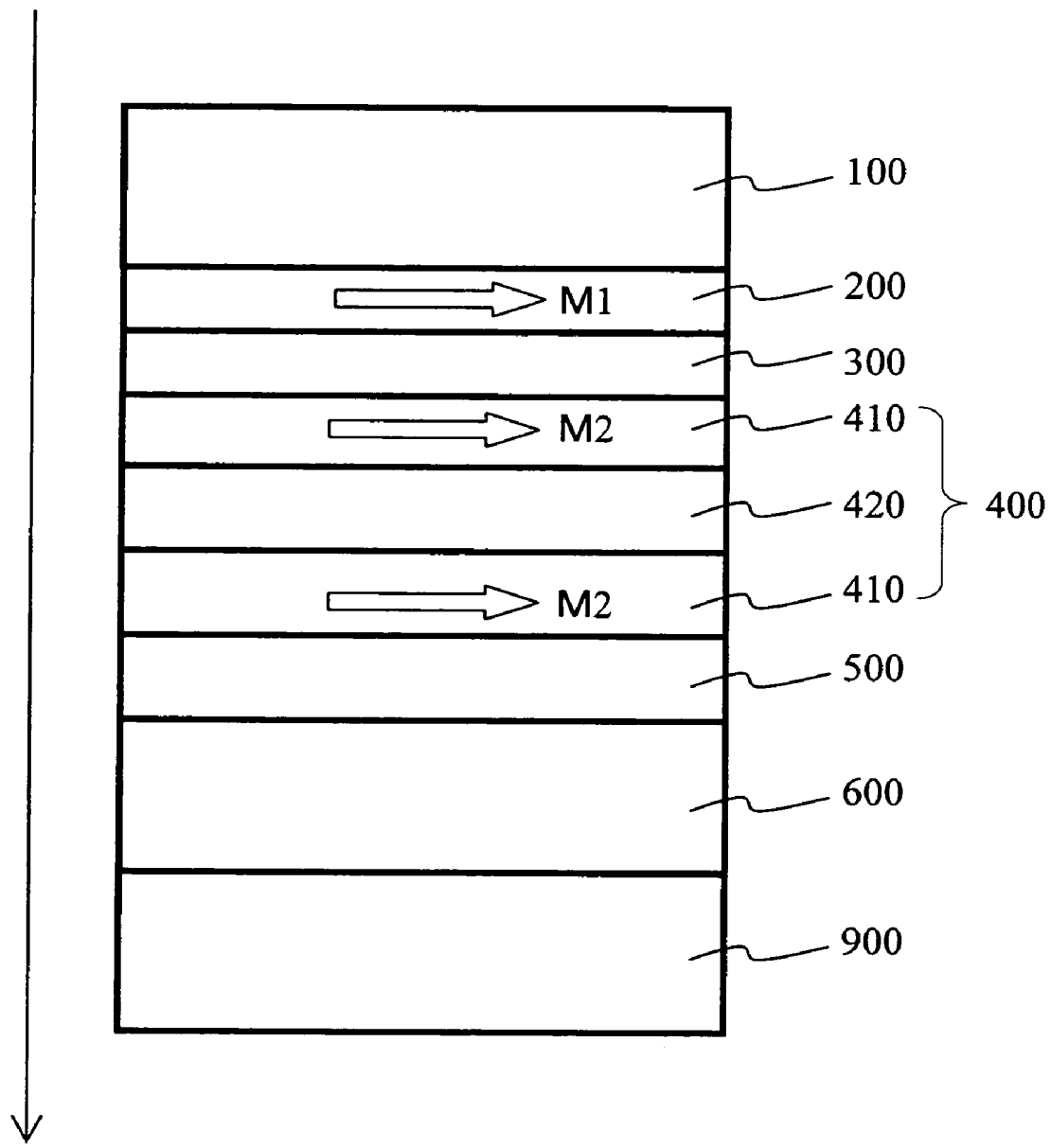

FIGS. 16A and 16B show the magnetization directions after the magnetization reversal of the free layer 400 has been exerted by the electric current I.

In the second embodiment, it is preferable that the magnetic coupling between the magnetic layers 410 forming the free layer 400 is strong enough to maintain the ferromagnetic coupling against the write current that is passed at the time of recording. With a weak magnetic coupling, the magnetization of at least one of the magnetic layers 410 may be reversed. Further, the magnetization of at least one layer is disturbed, and thereby the action of the spin-dependent electrons may become irregular. This may prevent the magnetic reversal of the free layer 400.

To maintain the magnetic coupling, preferably, the nonmagnetic layer 420 is composed of one of Cu (copper), Ag (silver), Au (gold), ruthenium (Ru), iridium (Ir), rhodium (Rh) and any alloy containing at least one of them. Furthermore, let Iw be a write current passed through a magnetic device with area A. The strength J of ferromagnetic coupling between the magnetic layers 410 preferably satisfies the following formula:

$$J > (hP/2e\alpha) \times (Iw/A) - t\pi Ms^2$$

where Iw/A denotes the current density, t and Ms the thickness and magnetization of a single constituent magnetic layer in the multilayer film, respectively, h the Planck's constant, P the spin asymmetry of current, e the electric charge, and α the Gilbert damping constant.

In this situation, a good ferromagnetic coupling can be maintained in the free layer 400 even if the write current Iw is passed.

Further, it is preferable that the magnetic coupling between the magnetic layers 410 forming the free layer 400 is strong enough to maintain the ferromagnetic coupling against sense current that is passed at the time of reproduction. With a weak magnetic coupling, spin-dependent reflection inside the free layer 400 may reverse part of magnetization M2 of the magnetic layers 410 at the time of reproduction, or may disturb magnetization M2.

To maintain the magnetic coupling, preferably, the nonmagnetic layer 420 is composed of one of Cu (copper), Ag (silver), Au (gold), ruthenium (Ru), iridium (Ir), rhodium (Rh) and any alloy containing them. Furthermore, let Is be a sense current passed through a magnetic device with area A. The strength J of ferromagnetic coupling between the magnetic layers 410 preferably satisfies the following formula:

$$J > (hP/2e\alpha) \times (Is/A) - t\pi Ms^2$$

where Is/A denotes the current density, t and Ms the thickness and magnetization of a single constituent magnetic layer in the multilayer film, respectively, h the Planck's constant, P the spin asymmetry of current, e the electric charge, and α the Gilbert damping constant.

In this situation, a good ferromagnetic coupling can be maintained in the free layer 400 even if the sense current Is is passed.

Also in this embodiment, it becomes possible to make the magnetization reversal current smaller if the magnetization of the second pinned layer 600 is set to be anti-parallel to the magnetization of the first pinned layer 200 as described with reference to FIG. 3 of the first embodiment.

Also in the present embodiment, as shown in FIGS. 13 and 14, the first pinned layer 200 or the second pinned layer 600 may be provided with magnetic layers that are antiferromagnetically coupled via a nonmagnetic layer of Ru (ruthenium) or the like and placed between the antiferromagnetic layer and the multilayer film. In this case, the thickness of the nonmagnetic layer of Ru is preferably set so that the antiferromagnetic coupling is exerted between the magnetic layers. The effect of this configuration is the same as previously described with reference to FIGS. 13 and 14. In addition, the first pinned layer 200 or the second pinned layer 600 may have an antiferromagnetic layer for fixing the magnetization of magnetic layers 210, or for fixing the magnetization of magnetic layers 610.

In this embodiment, the reproduction mechanism is same as the first embodiment.

Third Embodiment

Next, as a third embodiment of the invention, a magnetic device will be described in which the first pinned layer 200 and the free layer 400 are each multilayered.

Figure 17:
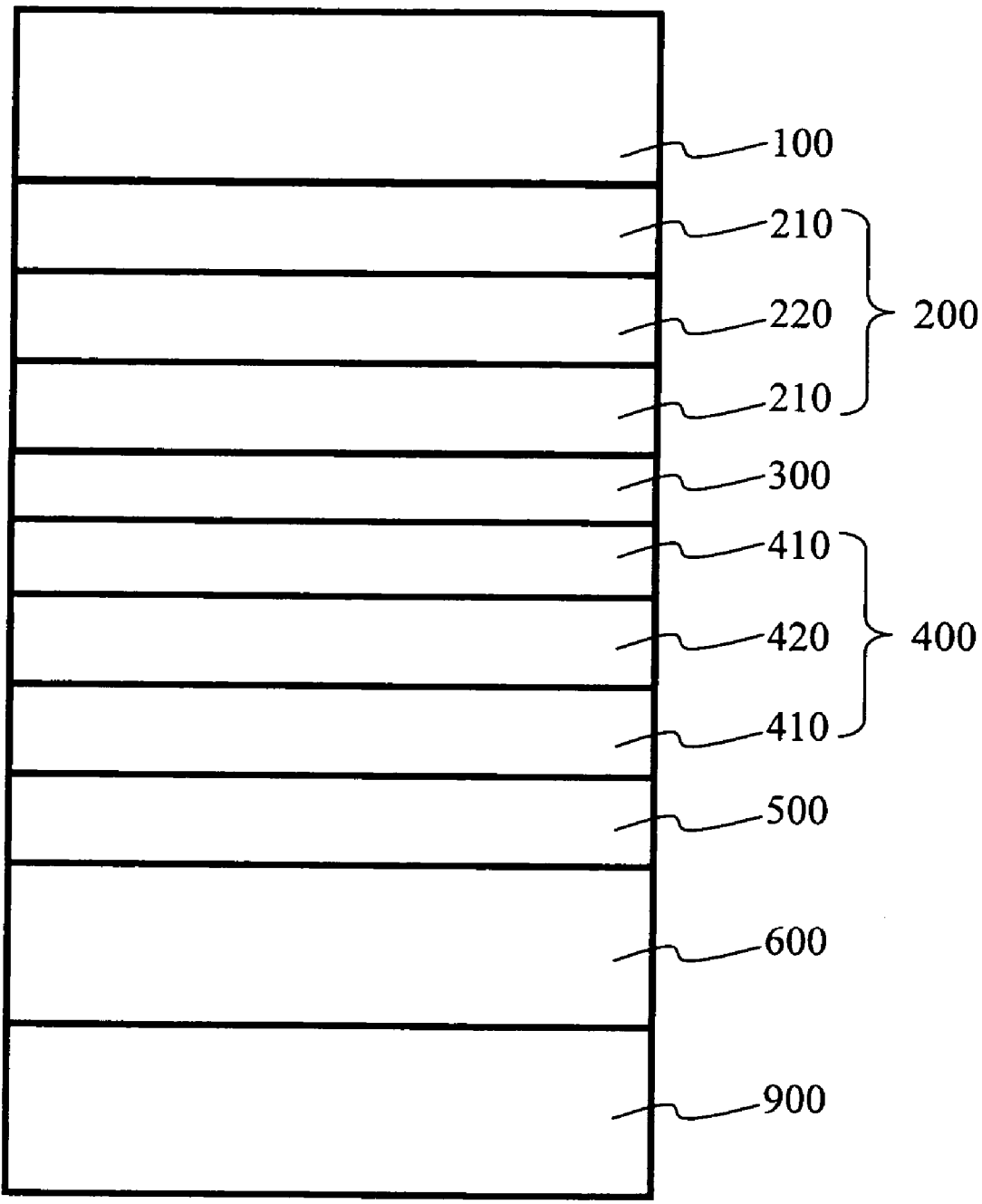
FIG. 17 is a schematic view illustrating a basic cross-sectional structure of a magnetic device according to a third embodiment of the invention.

FIG. 17 is a schematic view illustrating a basic cross-sectional structure of a magnetic device according to a third embodiment of the invention. In this figure again, the same elements as those previously described with reference to FIGS. 1 to 16 are given the same reference numerals and not described in detail.

In this embodiment, the first pinned layer 200 and the free layer 400 are each configured as a multilayer film composed of (magnetic layer/nonmagnetic layer)×N/magnetic layer (N=1 or greater) that are ferromagnetically coupled. That is, the first pinned layer 200 is configured such that magnetic layers 210 and nonmagnetic layers 220 are stacked alternately with each other, and that at least two of the magnetic layers 210 are ferromagnetically coupled via a nonmagnetic layer 220. Likewise, the free layer 400 is configured such that magnetic layers 410 and nonmagnetic layers 420 are stacked alternately with each other, and that the magnetic layers 410 are ferromagnetically coupled with each other via a nonmagnetic layer 420.

The magnetic device of this embodiment has a combined feature of the first and second embodiments. The functions and effects previously described with reference to these embodiments are simultaneously achieved.

Also in the present embodiment, as shown in FIGS. 13 and 14, the first pinned layer 200 or the second pinned layer 600 may be provided with magnetic layers that are antiferromagnetically coupled via a nonmagnetic layer of Ru (ruthenium) or the like and placed between the antiferromagnetic layer and the multilayer film. The effect of this configuration is the same as previously described with reference to FIGS. 13 and 14.

Fourth Embodiment

Next, as a forth embodiment of the invention, a magnetic device will be described in which the first pinned layer 200 and the second pinned layer 600 are each multilayered.

Figure 18:
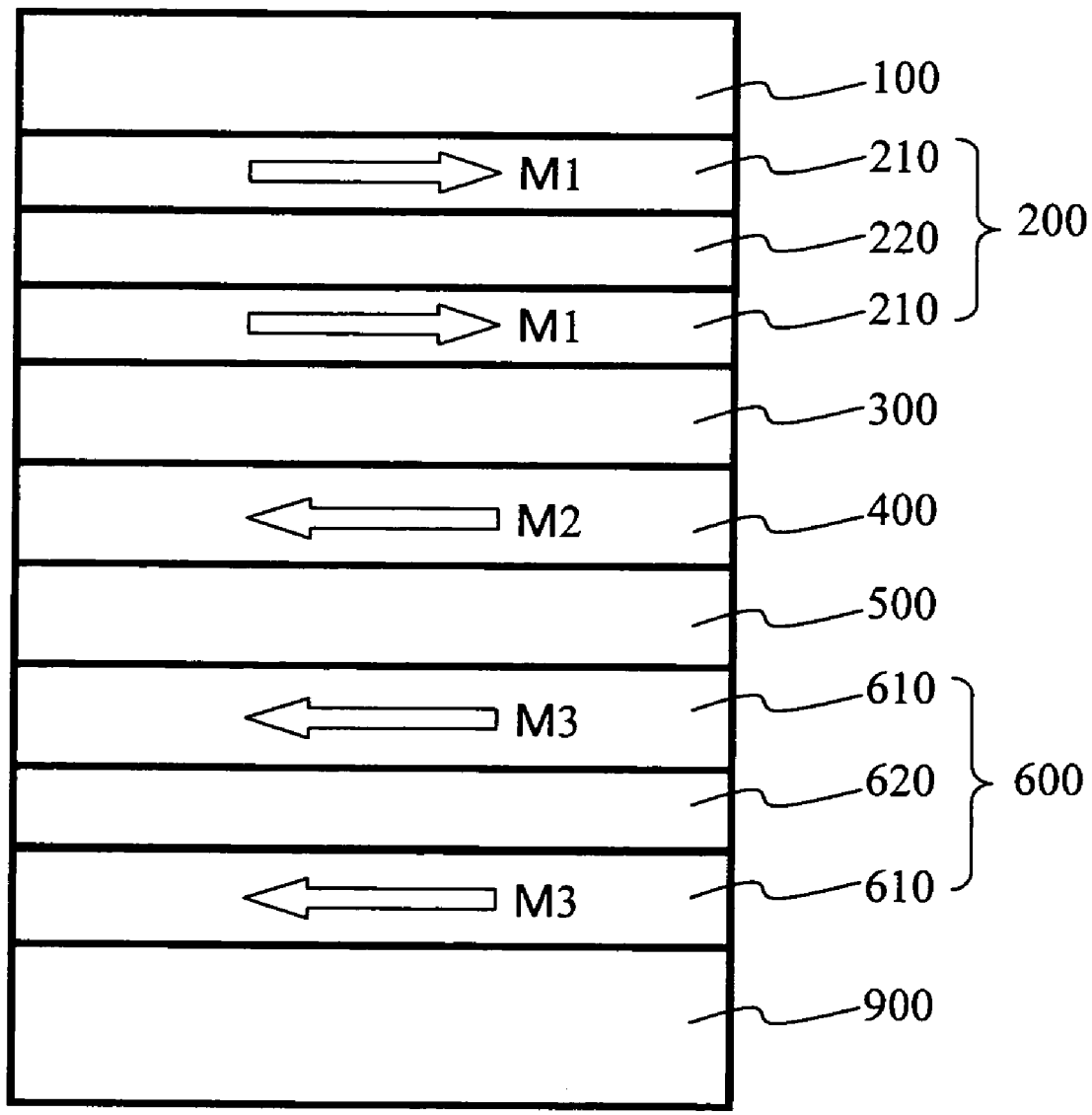
FIGS. 18 and 19 show schematic views illustrating basic cross-sectional structures of magnetic devices according to a fourth embodiment of the invention.
Figure 19:
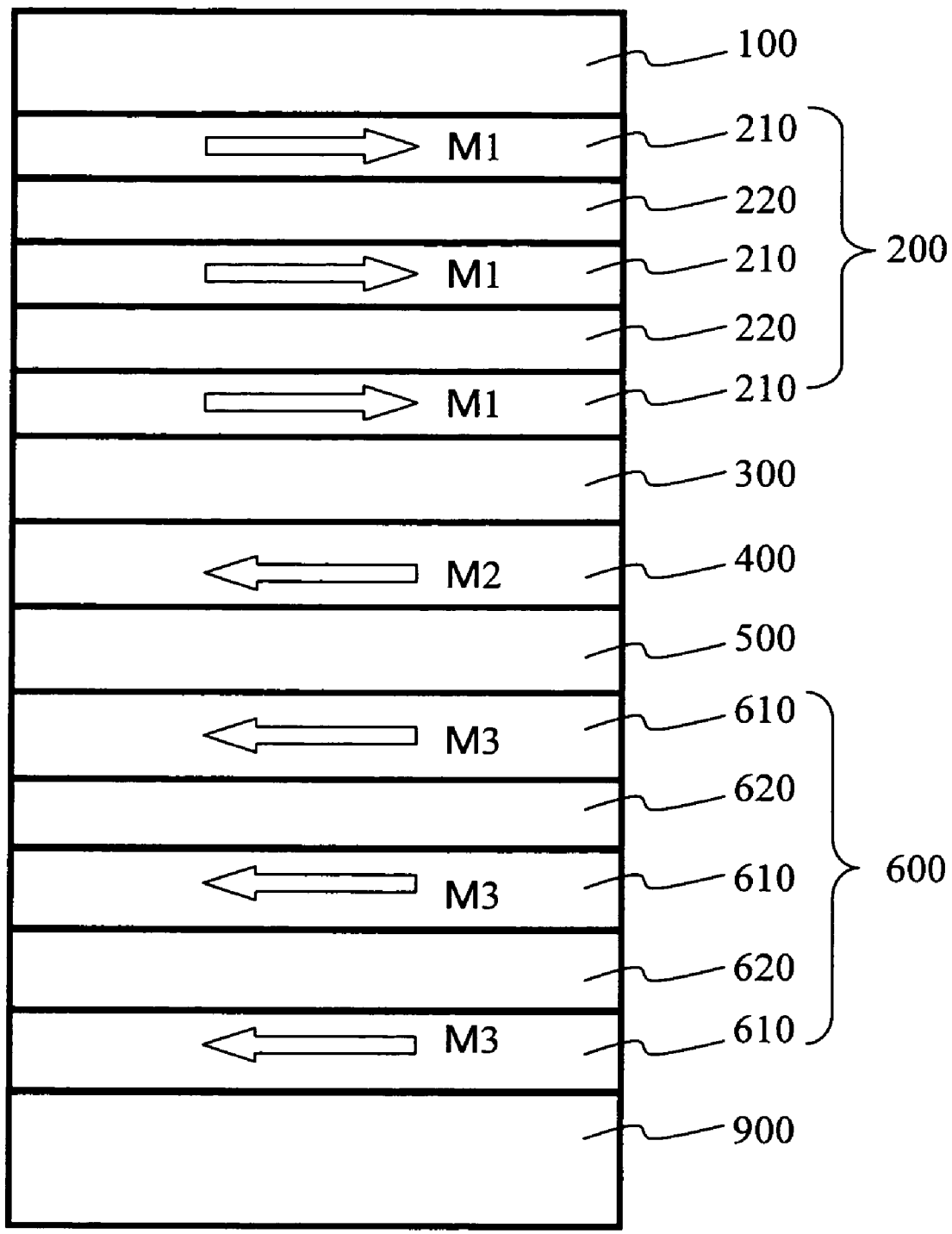
Figure 20:
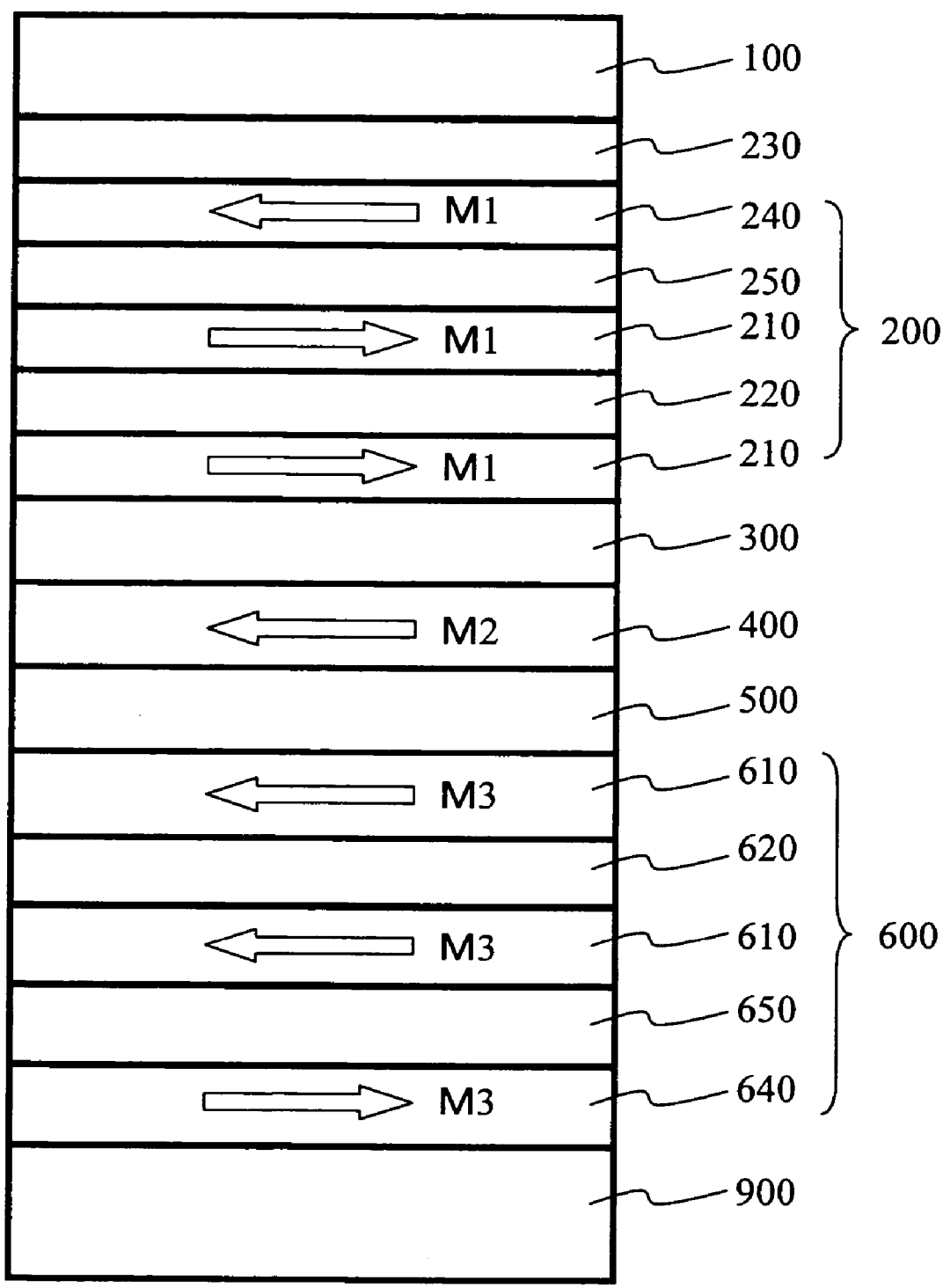
FIGS. 20 through 23 are schematic drawings showing such examples in which magnetization is fixed by antiferromagnetic coupling.
Figure 21:
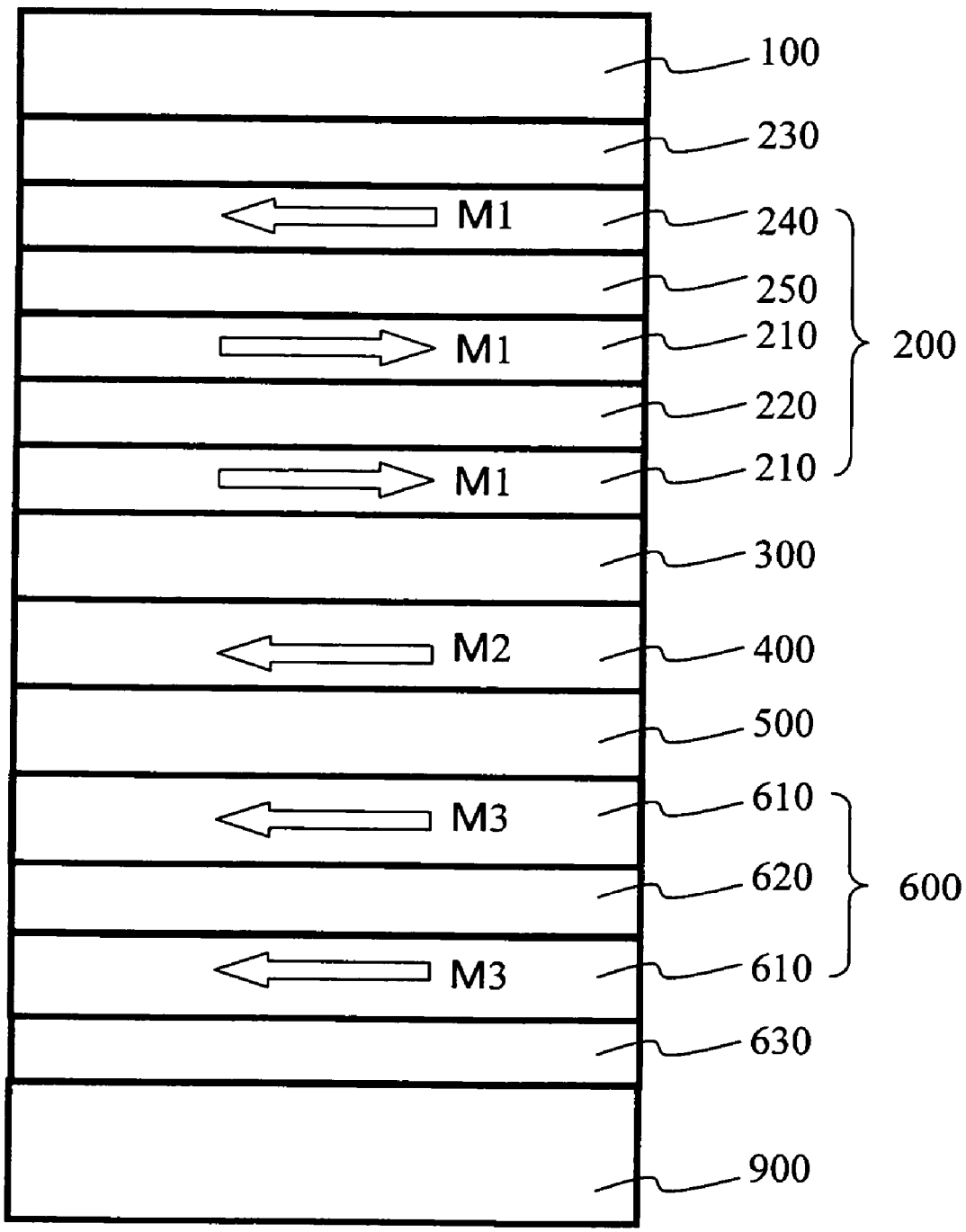
Figure 22:
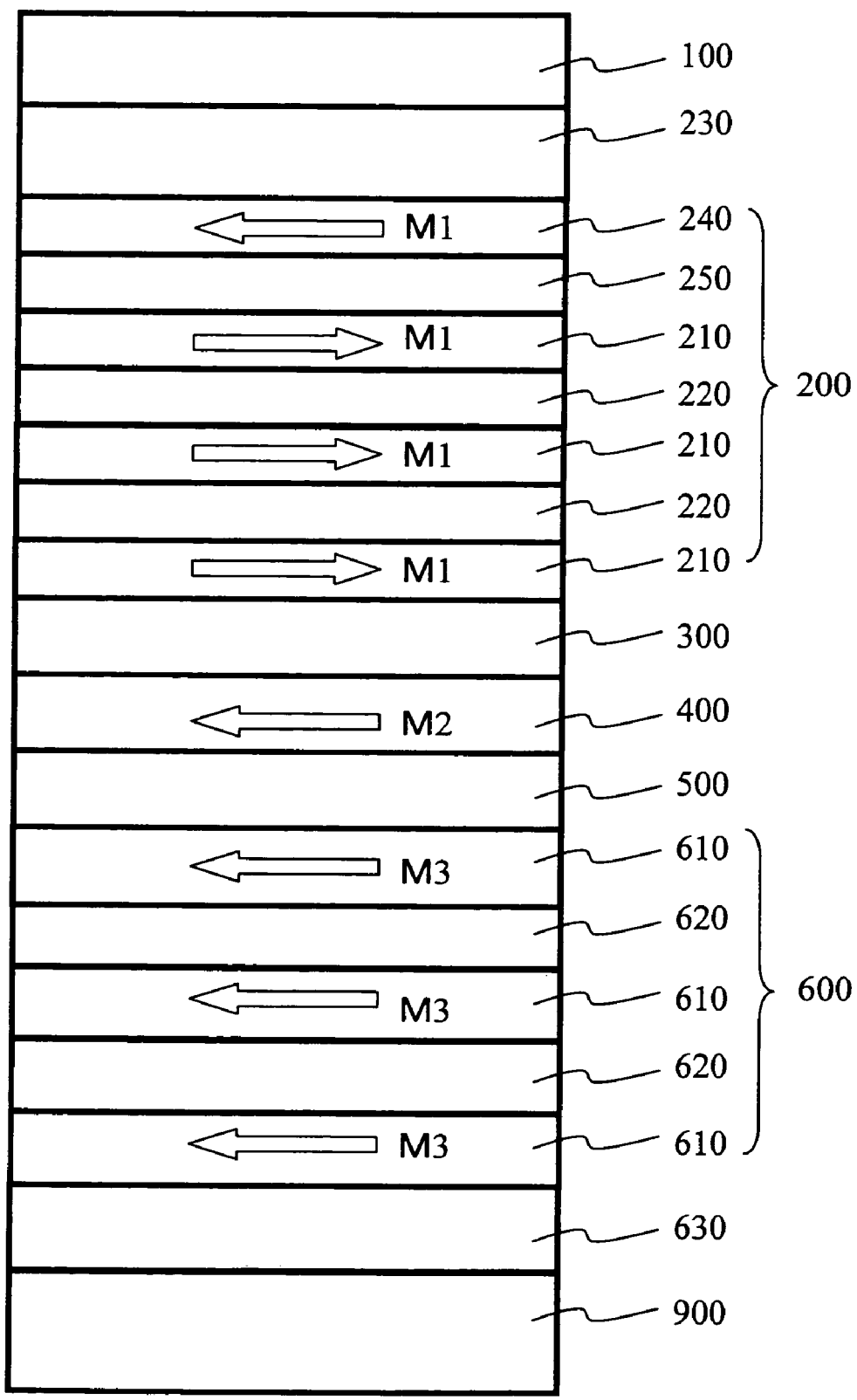
Figure 23:
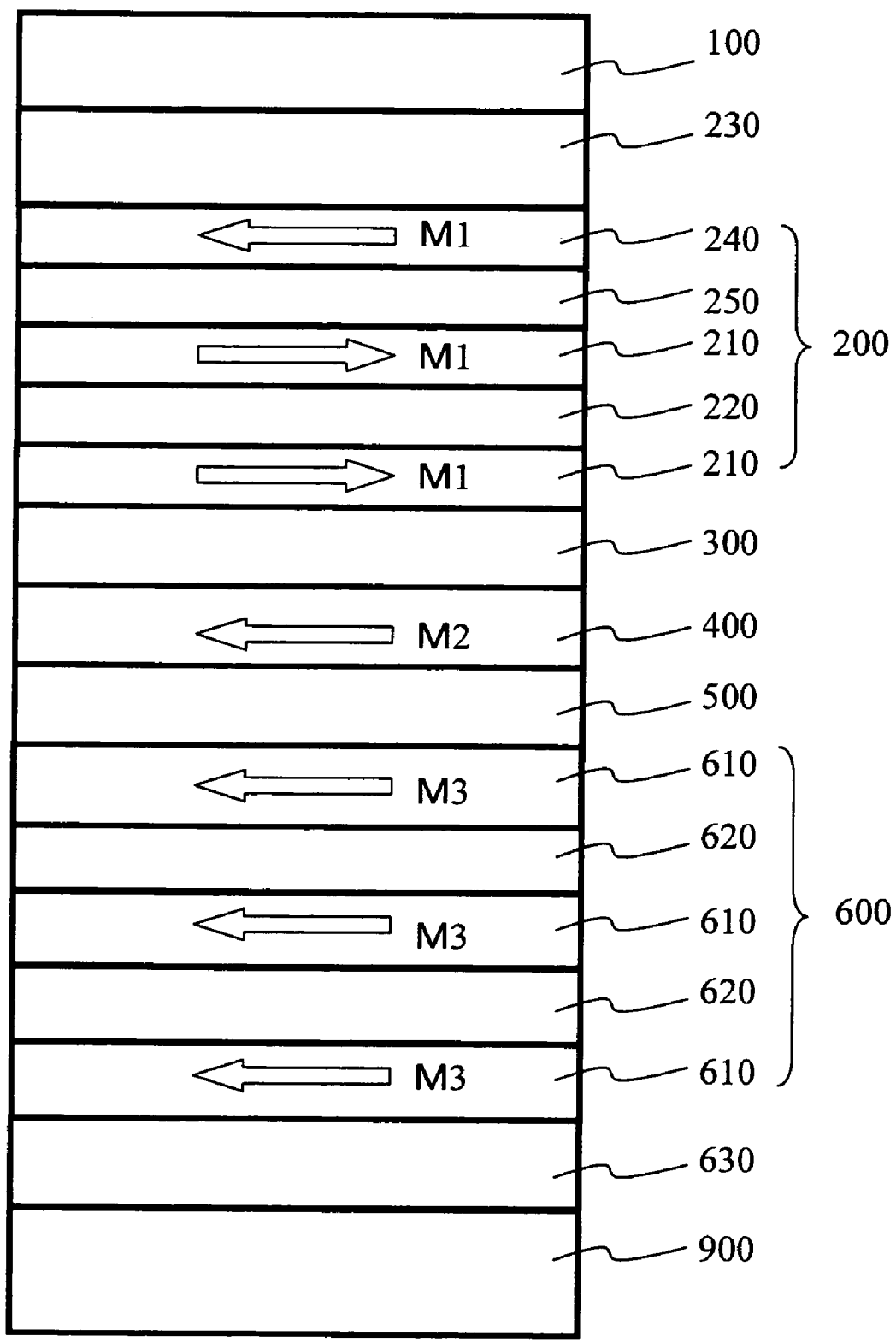

FIGS. 18 and 19 show schematic views illustrating basic cross-sectional structures of magnetic devices according to a fourth embodiment of the invention. In these figures again, the same elements as those previously described with reference to FIGS. 1 to 17 are given the same reference numerals and a detailed explanations will be omitted.

In this embodiment, the first pinned layer 200 and the second pinned layer 600 are each configured as a multilayer film composed of (magnetic layer/nonmagnetic layer)×N/magnetic layer (N=1 or greater) that are ferromagnetically coupled. That is, the first pinned layer 200 is configured such that magnetic layers 210 and nonmagnetic layers 220 are stacked alternately with each other, and that at least two of the magnetic layers 210 are ferromagnetically coupled via a nonmagnetic layer 220. Likewise, the pinned layer 600 is configured such that magnetic layers 610 and nonmagnetic layers 620 are stacked alternately with each other, and that the magnetic layers 610 are ferromagnetically coupled with each other via a nonmagnetic layer 620.

The magnetic device of this embodiment has an enhanced feature of the first embodiment. The basic functions and effects previously described with reference to these embodiments can be achieved. The existence of the two pinned layers 200 and 600 increases the multiple reflection of the spin polarized current resulting in more reduced reversal current.

Also in the present embodiment, as described with reference to FIGS. 13 and 14, the first pinned layer 200 or the second pinned layer 600 may be provided with magnetic layers that are antiferromagnetically coupled via a nonmagnetic layer of Ru (ruthenium) or the like and placed between the antiferromagnetic layer and the multilayer film.

FIGS. 20 through 23 are schematic drawings showing such examples in which magnetization is fixed by antiferromagnetic coupling. The effect of this configuration is the same as previously described with reference to FIGS. 13 and 14. For example, the magnetization of the magnetic layer 240 composed of ferromagnetic material of the first pinned layer 200 is fixed by the adjacent antiferromagnetic layer 230. Similarly, the magnetization of the magnetic layer 610 composed of ferromagnetic material of the second pinned layer 600 is fixed by the adjacent antiferromagnetic layer 630.

As described above in the first to fourth embodiments, according to the invention, magnetization M2 of the free layer 400 can be reversed with reduced current, which results in an effect of reducing power consumption and preventing device breakdown. Consequently, as described below in Examples, the recording/reproducing device of the invention is suitable for a solid magnetic memory, probe storage cell and the like.

Next, each of the elements forming the magnetic device of the invention described above in the first to fourth embodiments will be described in detail.

First, materials for a single layer, or for magnetic layers (such as 210 and 410) for multilayering, in the first and second pinned layers 200 and 600 and in the free layer 400, may include iron (Fe), cobalt (Co), nickel (Ni), or an alloy containing at least one element selected from the group consisting of iron (Fe), cobalt (Co), nickel (Ni), manganese (Mn) and chromium (Cr), a NiFe-based alloy called "permalloy", or a soft magnetic material such as a CoNbZr-based alloy, FeTaC-based alloy, CoTaZr-based alloy, FeAlSi-based alloy, FeB-based alloy and CoFeB-based alloy, a Heusler alloy, a magnetic semiconductor, a half-metal magnetic oxide (or half-metal magnetic nitride) such as $CrO_2$, $Fe_3O_4$ and $La_{1-x}Sr_xMnO_3$.

Here, the "magnetic semiconductors" may include a combination of at least one magnetic element of iron (Fe), cobalt (Co), nickel (Ni), chromium (Cr) and manganese (Mn), with a compound semiconductor or oxide semiconductor. More specifically, they may include, for example, (Ga,Cr)N, (Ga,Mn)N, MnAs, CrAs, (Ga,Cr)As, ZnO:Fe and (Mg,Fe)O.

In the present invention, any of these materials having magnetic properties suitable to applications can be appropriately selected and used for the pinned layers 200 and 600 and the free layer 400.

Materials for use in these magnetic layers may include a continuous magnetic material, or a composite structure in which fine particles of magnetic material are precipitated or formed in a nonmagnetic matrix.

Furthermore, materials for the free layer 400 may include a double-layer structure composed of ((Co or CoFe alloy)/(permalloy of NiFe or NiFeCo, or Ni)), or a triple-layer structure composed of ((Co or CoFe alloy)/(permalloy of NiFe or NiFeCo, or Ni)/(Co or CoFe alloy)). The effective magnetization can then be reduced without decreasing the spin polarization at the interface. As a result, the magnetic energy of the system can be reduced, and the magnetization can be reversed with lower current. In a magnetic layer composed of these magnetic multilayer structures, preferably, the outer Co or CoFe alloy has a thickness in the range of 0.2 to 1 nm. This structure enables magnetization reversal with lower current.

A preferable total thickness of magnetic layers forming the pinned layer 200 or 600 is in the range of 0.4 to 60 nm. A preferable total thickness of magnetic layers forming the free layer 400 is in the range of 0.4 to 60 nm. A preferable thickness of a magnetic layer forming these multilayer films is in the range of 0.2 to 10 nm.

In forming a multilayer film where the pinned layer 200, 600 or the free layer 400 is ferromagnetically coupled, typical combinations of materials for nonmagnetic and magnetic layers may include a combination of CoFe having a fcc (face centered cubic) structure with Cu such as CoFe/Cu/CoFe and CoFe/Cu/CoFe/Cu/CoFe, or a combination of CoFe having a bcc (body centered cubic) structure (such as $Co_{0.5}Fe_{0.5}$) with Cu, bcc-Fe/fcc-Au and bcc-Fe/fcc-Ag.

Materials for the first intermediate layer 300 and the second intermediate layer 500 may include copper (Cu), gold (Au), silver (Ag), aluminum (Al), or an alloy containing one or more of them, an insulator composed of oxides, nitrides or fluorides containing at least one element selected from the group consisting of aluminum (Al), titanium (Ti), tantalum (Ta), cobalt (Co), nickel (Ni), silicon (Si) and iron (Fe), or a ballistic MR material where pinholes are formed in any of these insulators and magnetic layers enter the pinholes.

In particular, in order to increase the reversal efficiency, preferable materials for the first intermediate layer 300 are conductive metals such as copper (Cu), gold (Au), silver (Ag), aluminum (Al), or an alloy containing one or more of them. A thickness of 1 to 60 nm for the first intermediate layer 300 can achieve the effect of magnetization reversal.

Furthermore, in particular, materials for the second intermediate layer 500 may be an insulator composed of oxides, nitrides or fluorides containing at least one element selected from the group consisting of aluminum (Al), titanium (Ti), tantalum (Ta), cobalt (Co), nickel (Ni), silicon (Si) and iron (Fe), or a ballistic MR material where pinholes are formed in any of these insulators and magnetic layers enter the pinholes, to obtain a large reproduction output. This point is described previously with reference to FIGS. 10 and 11. A preferable thickness of the tunneling magnetoresistance effect (TMR) insulator in the former is 0.4 to 2 nm in view of signal reproduction. In the latter case of ballistic MR materials, a preferable thickness of the intermediate layer 500 is in the range of 0.4 to 40 nm.

Same effect can be obtained by converting the materials and the thicknesses of the first and the second intermediate layers.

Antiferromagnetic materials for fixing magnetizations M1 and M3 of the pinned layers 200 and 600 may include iron manganese (FeMn), platinum manganese (PtMn), palladium manganese (PdMn), and palladium platinum manganese (PdPtMn).

In a preferable planar shape of the magnetic device of the present invention, the free layer 400 has a planar shape of rectangle, vertically (or horizontally) oblong hexagon, ellipse, rhombus or parallelogram having an aspect ratio in the range of 1:1 to 1:5. Preferably, the shape is resistant to forming the so-called "edge domain", and apt to presenting uniaxial shape magnetic anisotropy. It is also preferable that the free layer 400 has a dimension of its longitudinal side within the range of about 5 to 1000 nm.

Although FIGS. 1 to 23 represent the pinned layers 200 and 600, free layer 400, and intermediate layers 300 and 500 between two electrodes 100 and 900 as having the same lateral size, it is not necessary that the lateral size is uniform. More specifically, each layer of the magnetic device may have a different width or slope relative to each other in order to connect wiring, to control magnetization direction, or to facilitate device fabrication. In particular, when the pinned layer 600 is composed of a single magnetic layer, the lateral size of the magnetic layer can be considerably greater than the device size to advantageously reduce the influence of leakage magnetic field from the pinned layer 600 upon the free layer 400 that would otherwise disturb the reversal behavior in the free layer 400.

In the magnetic device of the present invention, it is preferable that the axis of easy magnetization for the free layer 400 is directed generally parallel or generally antiparallel to the direction of magnetic anisotropy (including unidirectional anisotropy) in the pinned layers 200 and 600.

It should be noted that the stacking order in the magnetic device shown in FIGS. 1 to 23 is not limited to those shown in the figures. It may be configured upside down.

Also, it should be noted that the amount of the magnetization of each of the magnetic layers in the pinned layer or in the free layer is not necessarily identical.

The embodiments of the invention will now be described in further detail with reference to examples.

EXAMPLE 1

In a first example of the invention to be described, a film formation apparatus that achieves a sharp interface without any significant interface mixing is used to fabricate a stacked structure in which the first intermediate layer 300 is made of Cu and the second intermediate layer 500 is made of alumina. The structure is then formed into a device. The device is subjected to writing by current injection via the first intermediate layer 300, and to reproduction by tunneling magnetoresistance (TMR) via the second intermediate layer 500.

First, in order to determine the thickness of the nonmagnetic layer 220 to achieve ferromagnetic coupling between the magnetic layers 210, a film having a triple-layer sandwiched structure of CoFe/Cu/CoFe was fabricated, and investigated on how the exchange interaction between CoFe layers depends on the thickness of Cu layer.

Figure 24:
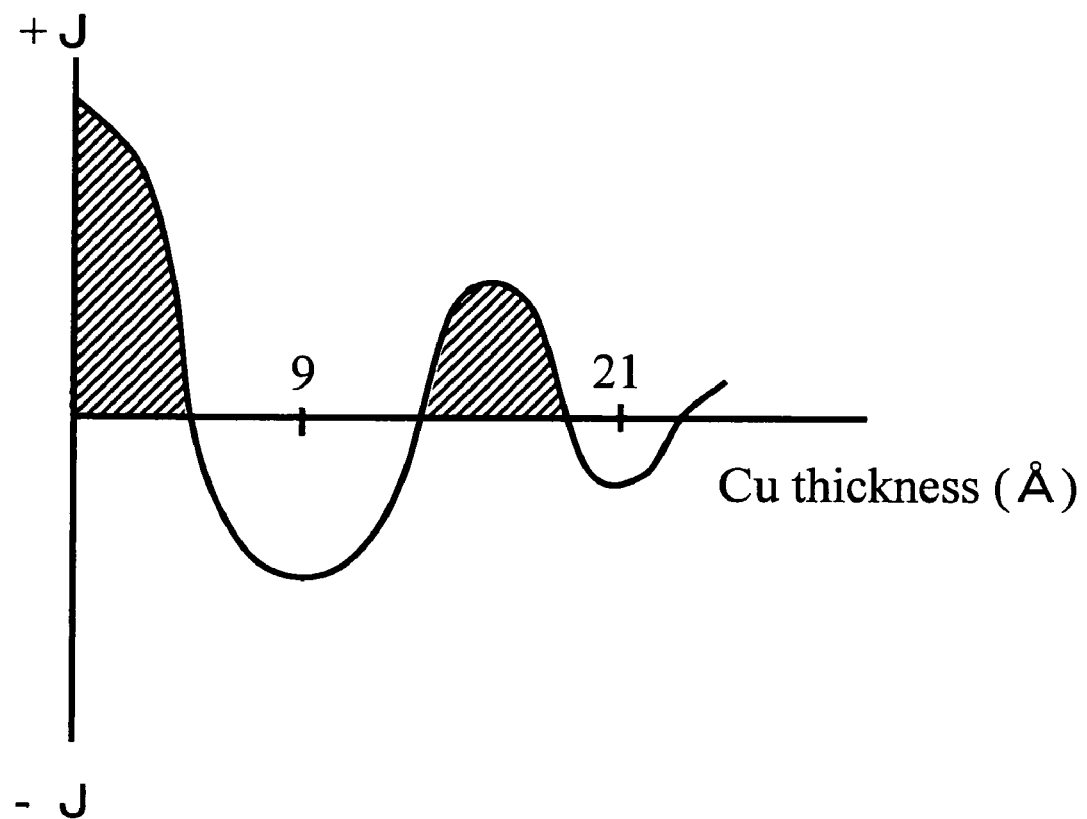
FIG. 24 is a graphical diagram showing the relation of the exchange interaction between CoFe layers versus the thickness of Cu layer.

FIG. 24 is a graphical diagram showing the relation of the exchange interaction between CoFe layers versus the thickness of Cu layer. This result was obtained by determining the strength of antiferromagnetic coupling from the saturation magnetic field in the hysteresis curve. The antiferromagnetic coupling was determined by fitting to the oscillatory curve for the thickness of Cu layer. As shown in FIG. 24, it was found that the film thickness that can be used for Cu layer ranges ≦0.5 nm or 1.3-1.7 nm to the extent measured. Thus in the present example, the thickness of Cu layer was selected to be 0.4 nm.

The process of device fabrication in the present example is as follows. An ultrahigh vacuum sputtering apparatus was used to form a lower electrode film composed of Ta and Cu on a wafer. A film having the following stacked structure was then fabricated.

(Sample 1)

(PtMn20 nm/CoFe20 nm)/Al$_2$O$_3$1 nm/(CoFe1 nm/Cu0.4 nm/CoFe1 nm)/Cu6 nm/(CoFe3 nm/Cu0.4 nm/CoFe3 nm/Ru1 nm/CoFe3 nm/PtMn20 nm)

(Sample 2)

(PtMn20 nm/CoFe20 nm)/Al$_2$O$_3$1 nm/(CoFe2.4 nm)/Cu6 nm/(CoFe7.8 nm/Ru1 nm/CoFe3 nm/PtMn20 nm)

(Sample 3)

(PtMn20 nm/CoFe20 nm)/Al$_2$O$_3$1 nm/(CoFe1 nm/Cu1.8 nm/CoFe1 nm)/Cu6 nm/(CoFe3 nm/Cu1.8 nm/CoFe3 nm/Ru1 nm/CoFe3 nm/PtMn20 nm)

Here Sample 1 is a device of the present example, Sample 2 is a sample that contains no ferromagnetic layer for comparison purposes, and Sample 3 is a sample that has a weak ferromagnetic coupling for comparison purposes as well. Another film composed of Cu and Ta was formed on these films. The wafer was annealed in a vacuum furnace in magnetic field at 270° C. for 10 hours for providing unidirectional anisotropy. An EB (electron beam) resist was applied to the films and EB exposed. A mask having a desired shape (here its size was 60 nm×120 nm and its longitudinal direction was parallel to the unidirectional anisotropy) was then formed.

Next, an ion milling apparatus was used to etch the region not covered with the mask down to alumina (Al$_2$O$_3$) layer. Here, the amount of etching can be precisely monitored by introducing sputtered particles into a quadrupole analyzer for mass spectrometry by means of actuated pumping. After the etching, the mask was removed, and a film of SiO$_2$ was further formed. Its surface was smoothed by ion milling for exposing Ta surface. An upper electrode was formed on the Ta surface.

Figure 25:
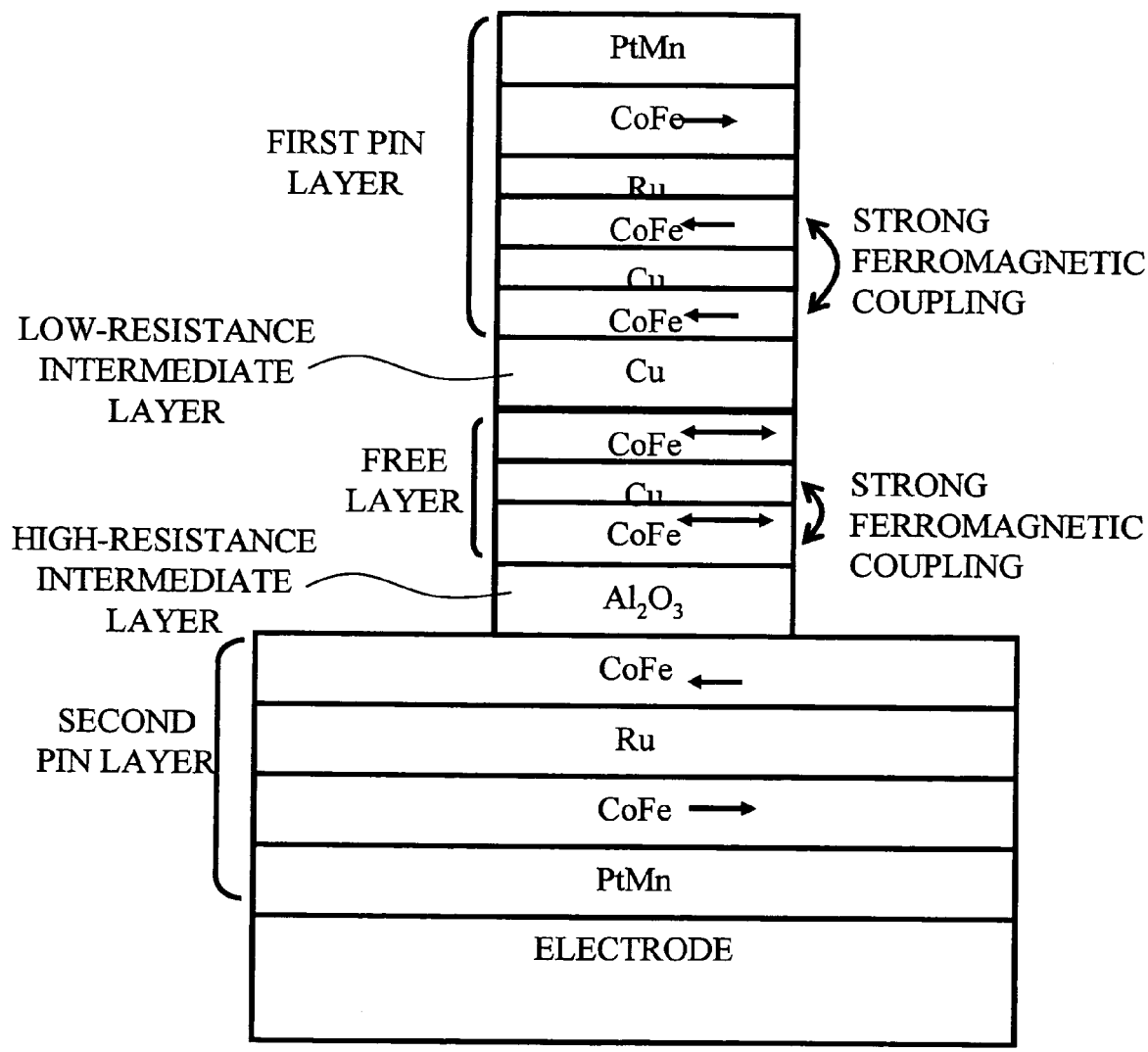
FIG. 25 is a schematic view showing a cross-sectional structure of Sample 1.

FIG. 25 is a schematic view showing a cross-sectional structure of Sample 1.

Figures 26A, 26B:
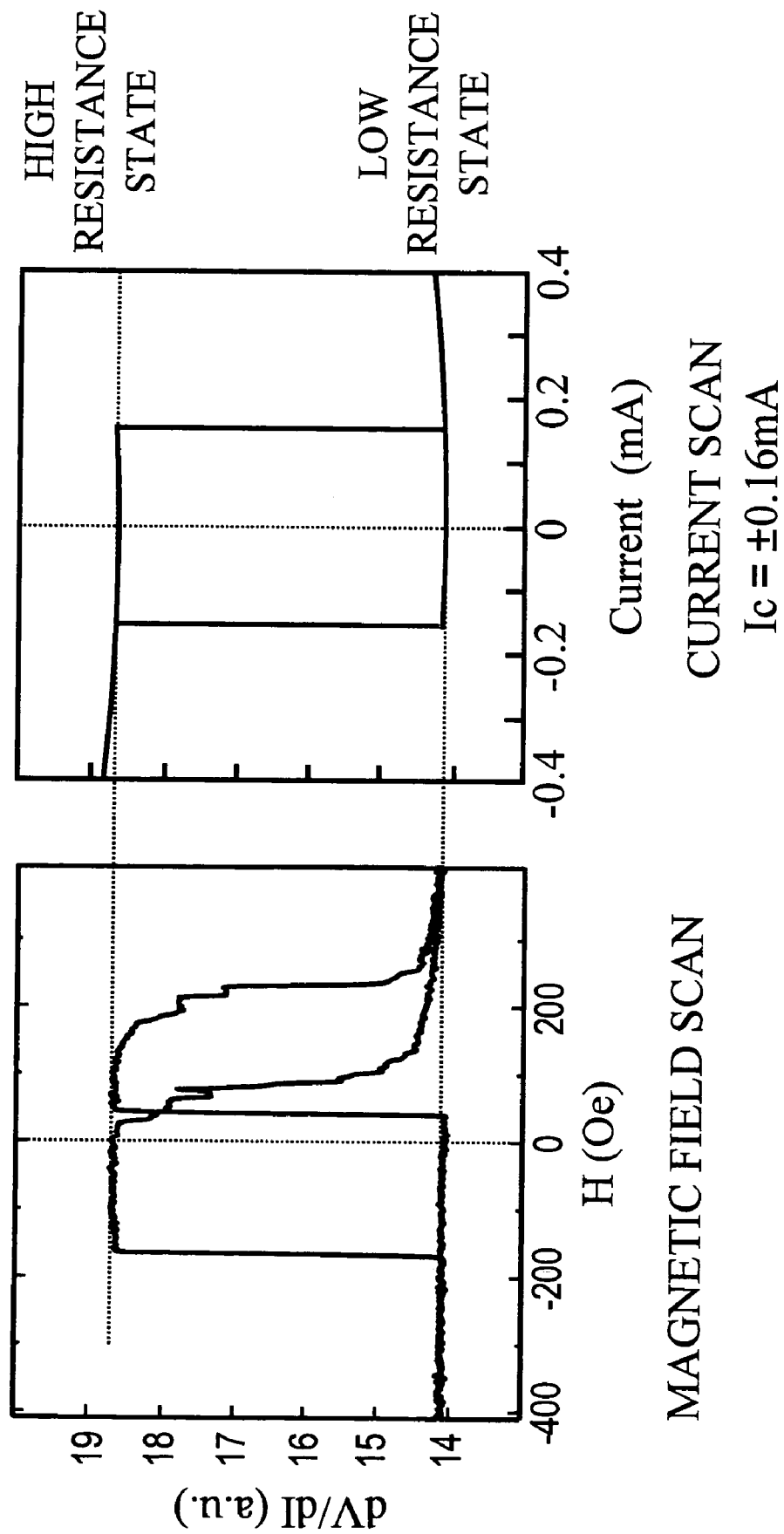
FIGS. 26A and 26B are graphical diagrams showing the measurements of magnetoresistance effect and current dependency of the resistance for Sample 1, respectively.

FIGS. 26A and 26B are graphical diagrams showing the measurements of magnetoresistance effect and current dependency of the resistance for Sample 1, respectively.

The resistance variation observed here is the tunneling magnetoresistance (TMR) via a high-resistance layer of alumina. The resistance variation during current scan (FIG. 26B) is the same as the resistance variation during magnetoresistance effect (FIG. 26A). It can be seen that above a critical current Ic, the magnetization of the free layer 400 is reversed and recording is achieved. The critical current Ic for Sample 1 was ±0.16 mA, and thus magnetization was reversed at a current density of 2.2×10$^6$ A/cm$^2$.

On the other hand, in Sample 2, no magnetization reversal was observed in the current range up to the breakdown of the tunnel junction portion of the intermediate layer 500. In Sample 3, a certain variation of resistance was observed at about half the breakdown current, which suggested that a portion of the multilayer film adjacent to the alumina layer 500 was reversed. However, any good hysteresis was not obtained in the current range up to breakdown.

The above result reveals that the reversal current is reduced by providing the first pinned layer 200 and the free layer 400 with strong ferromagnetic coupling.

EXAMPLE 2

In a second example of the invention to be described, a film formation apparatus that involves strong mixing is used to fabricate a thin film.

More specifically, a sandwiched film similar to Example 1 was fabricated and the thickness dependence of the nonmagnetic layer 220 was determined. However, a PtMn layer was provided to apply unidirectional anisotropy to one of the magnetic layers 210 in order to facilitate determining any positive interlayer coupling.

Figure 27:
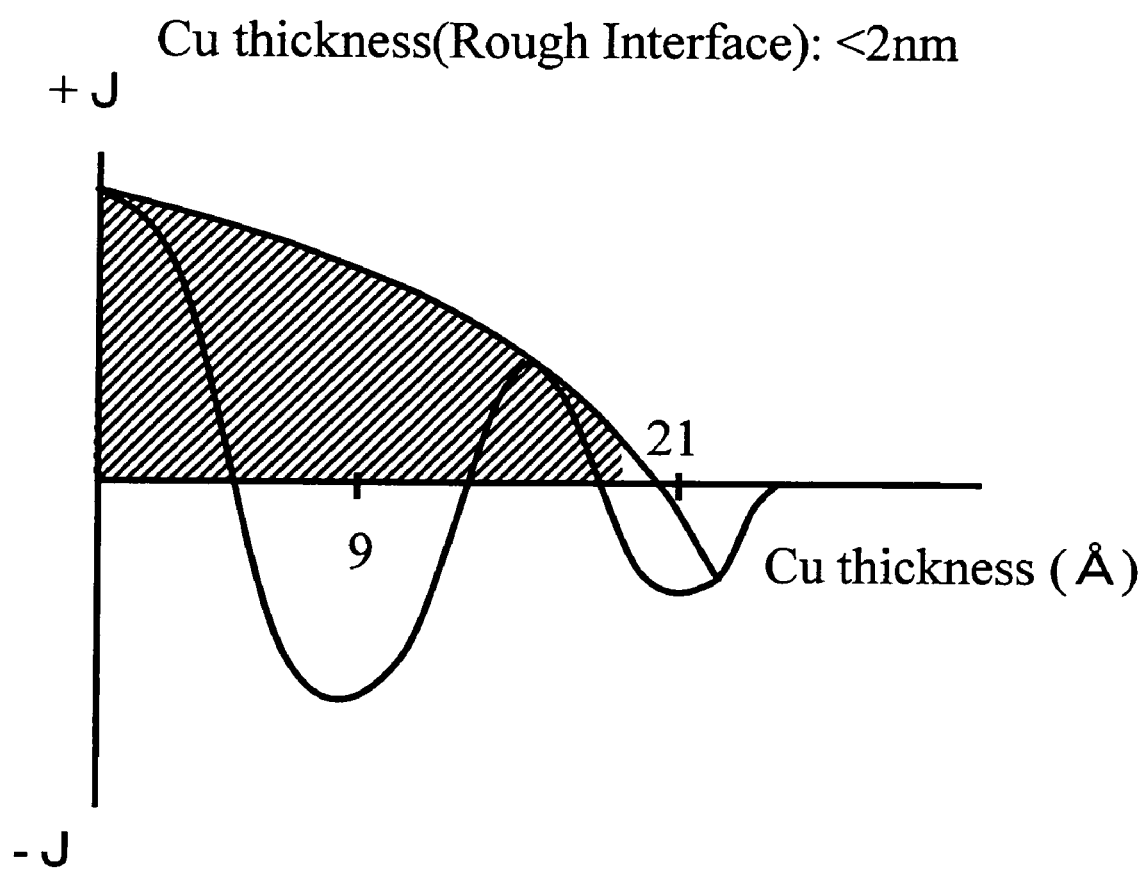
FIG. 27 is a graphical diagram showing the relation of the exchange interaction between CoFe layers versus the thickness of Cu layer.

FIG. 27 is a graphical diagram showing the relation of the exchange interaction between CoFe layers versus the thickness of Cu layer. Based on this result, the film thickness of the nonmagnetic layer 220 was selected to be 1.9 nm. The first pinned layer 600 was formed to be a multilayer film of magnetic layers 210 and nonmagnetic layers 220. A device having a layered structure similar to that shown in FIG. 1 was then fabricated by a process similar to Example 1. The resistance variation for the obtained magnetic device during current scan was investigated. The result revealed that a sharp resistance variation appeared at the critical reversal current during current scan, which confirmed that the multilayer film of magnetic layers 210 works cooperatively.

EXAMPLE 3

In a third example of the invention to be described, a sample similar in structure to Sample 1 of Example 1 described above was fabricated, except that in the free layer 400, a Cu layer having a film thickness of 0.1 nm was inserted into a $Co_{0.5}Fe_{0.5}$ layer with bcc composition having a film thickness of 2 nm. The critical reversal current for this device was ±0.14 mA, which achieved reversal at a still lower current density than Sample 1. This is presumably a contribution of bulk scattering effect inside bcc-CoFe due to the presence of mixing Cu layer.

EXAMPLE 4

In a fourth example of the invention to be described, a process similar to Example 1 described above was used to fabricate a magnetic device having the following stacked structure.

(PtMn20 nm/CoFe5 nm)/$Al_2O_3$1 nm/(CoFe1 nm/Cu0.2 nm/CoFe1 nm)/Cu6 nm/(CoFe3 nm/Cu0.4 nm/CoFe3 nm/Ru1 nm/CoFe3 nm/PtMn20 nm)

Samples A and B were fabricated. Sample A has a cross-sectional configuration, as schematically shown in FIG. 28, in which milling for cutting out a microdevice is stopped at a depth halfway through the alumina layer, while in Sample B the device is completely cut through to the PtMn layer.

The magnetoresistance effect was first determined. Sample A exhibited hysteresis similar to the magnetic field scan shown in FIG. 26A. However, in Sample B, a strong magnetostatic coupling appeared, in which the upper and lower magnetic layers across the alumina layer 500 are strongly coupled antiparallel to each other. The result of current scan for Sample B revealed that any complete reversal was not observed up to the breakdown current because this magnetostatic coupling was too strong, which prevented a good reversal behavior. On the other hand, in Sample A, magnetostatic coupling did not appear because magnetic poles in the second pinned layer 600 were negligible, and the magnetization of the free layer 400 was reversed at ±0.2 mA.

Figure 28:
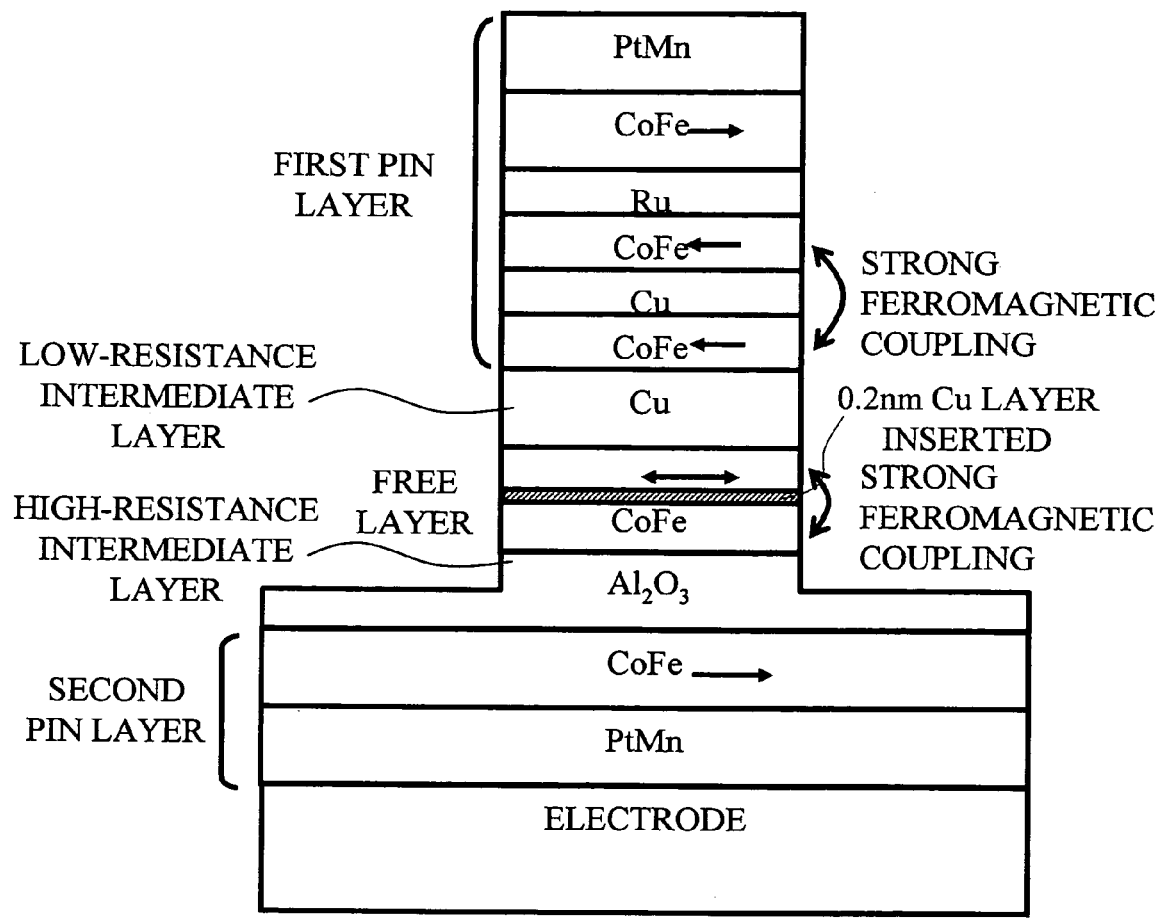
FIG. 28 is a schematic view showing Sample A as a fourth example of the invention.

In FIG. 28, the device has a vertical side face halfway through the alumina layer. However, transmission electron microscopy observation of cross-sectional samples has demonstrated that the side face was actually slanted at about 30° to 60°.

EXAMPLE 5

In a fifth example of the invention to be described, the magnetic device of the invention described above is specifically adapted to a magnetic memory.

FIGS. 29A, 29B, 30A and 30B are schematic views illustrating a magnetic memory that uses a magnetic device of the invention.

Figure 31:
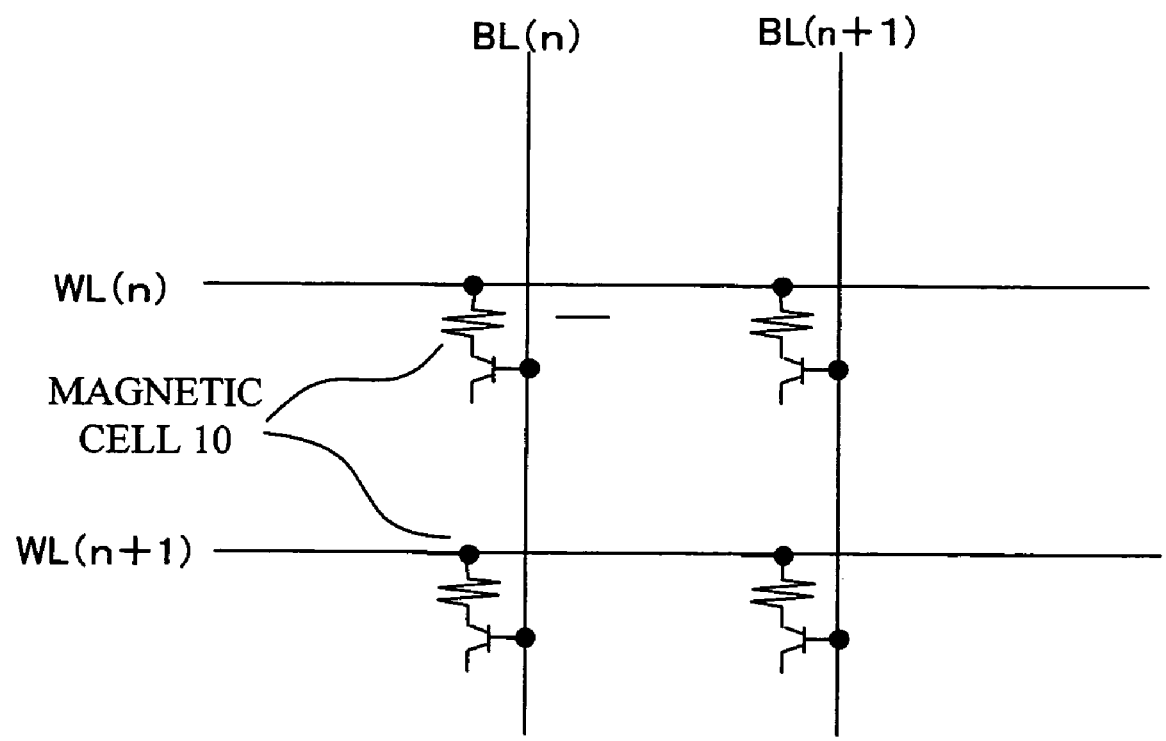
FIG. 31 is an equivalent circuit diagram for a magnetic memory of the example of the invention.

FIG. 31 is an equivalent circuit diagram for a magnetic memory of this example.

Here, a magnetic device (magnetic cell) 10 similar to Sample 1 of Example 1 is used. In this architecture, one transistor is assigned to one device. The device is formed between orthogonal word line WL and bit line BL so that it can be used as a magnetic memory. Each of a plurality of magnetic devices in a parallel arrangement can be selected by specifying a bit line BL and a word line WL.

Figure 29A:
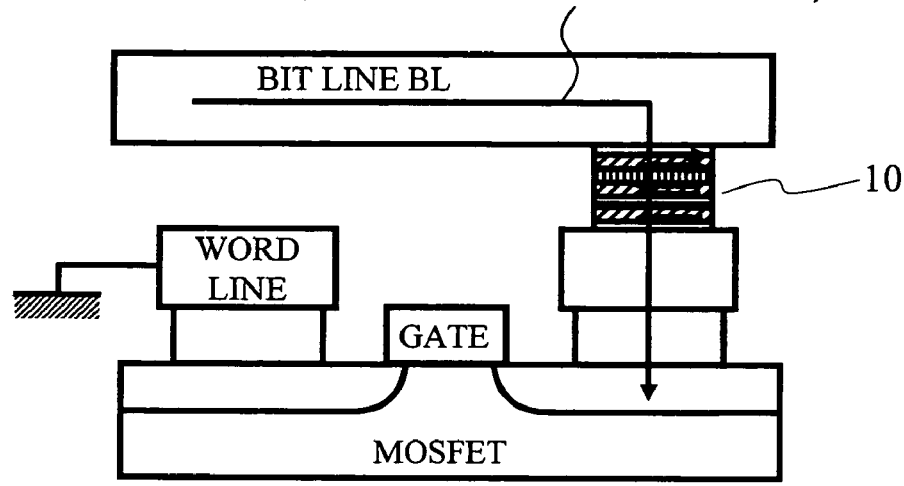
FIGS. 29A, 29B, 30A and 30B are schematic views illustrating a magnetic memory that uses a magnetic device of the invention.
Figure 29B:
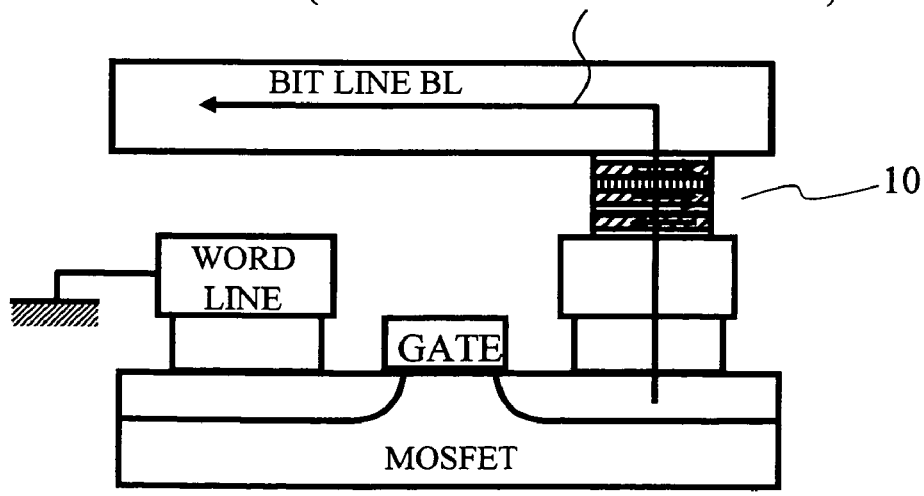

Recording to the magnetic device 10 is carried out, as shown in FIGS. 29A and 29B, by passing write current Iw higher than the critical reversal current Ic. Magnetization M2 recorded in the free layer 400 is directed parallel to magnetization M1 of the first pinned layer 200 when electrons are first passed through the first pinned layer 200 (corresponding to "WRITING SIGNAL 1" in FIG. 29B).

On the other hand, when the electron flow is reversed (corresponding to "WRITING SIGNAL 0" in FIG. 29A), magnetization M2, which is antiparallel to magnetization M1 of the first pinned layer 200, is recorded in the free layer 400.

Consequently, reversing the polarity of current allows "0" or "1" to be appropriately written.

Figure 30A:
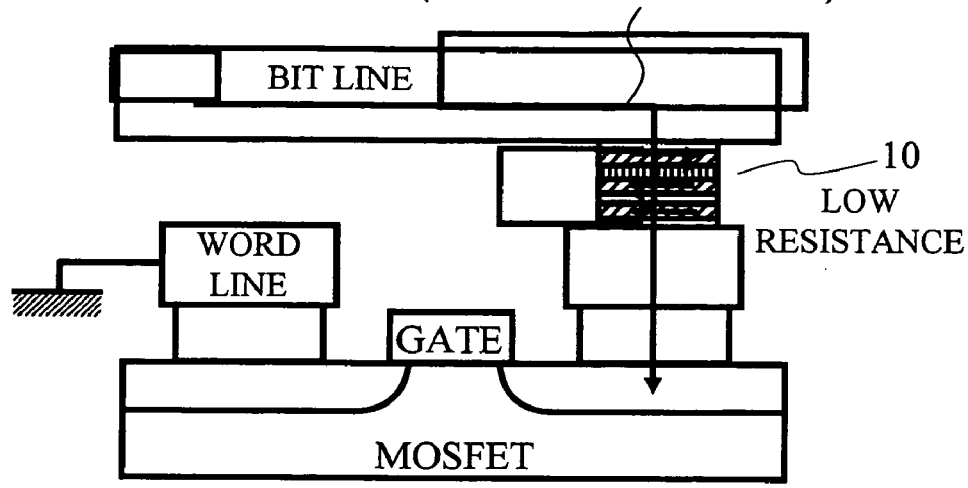

Reproduction is carried out, as shown in FIGS. 30A and 24B, bypassing a reproduction current (sense current) Is lower than the critical reversal current Ic and detecting magnetoresistance effect via the second intermediate layer 500. For example, as shown in FIG. 30A, when a signal "0" has been written, the resistance represents a low resistance. When a signal "1" has been written, the resistance represents a higher resistance. By detecting this (that is, directly reading the resistance, or reading the voltage, or reading the current), the state of magnetization M2 of the free layer 400 can be sensed for signal reproduction. In view of compatibility with transistors Tr, the second intermediate layer 500 is preferably formed from highly insulating material such as alumina. In this situation, the tunneling magnetoresistance effect (TMR) is to be detected.

Figure 30B:
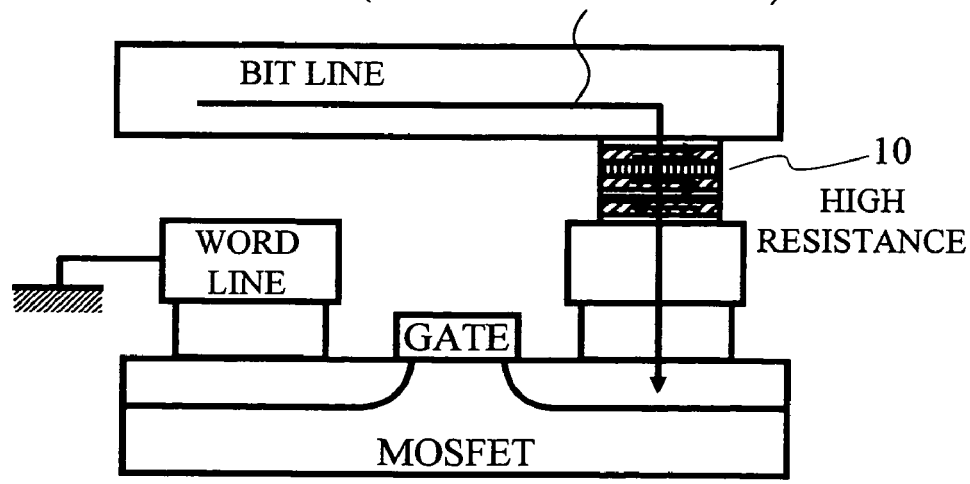

Although FIGS. 30A and 30B show the assignment of reproduction signals where "0" is assigned to a low resistance and "1" is assigned to a high resistance, it is understood that the assignment may be reversed.

EXAMPLE 6

In a sixth example of the invention to be described, the magnetic device of the invention is adapted to a cross-point magnetic memory.

Figure 32:
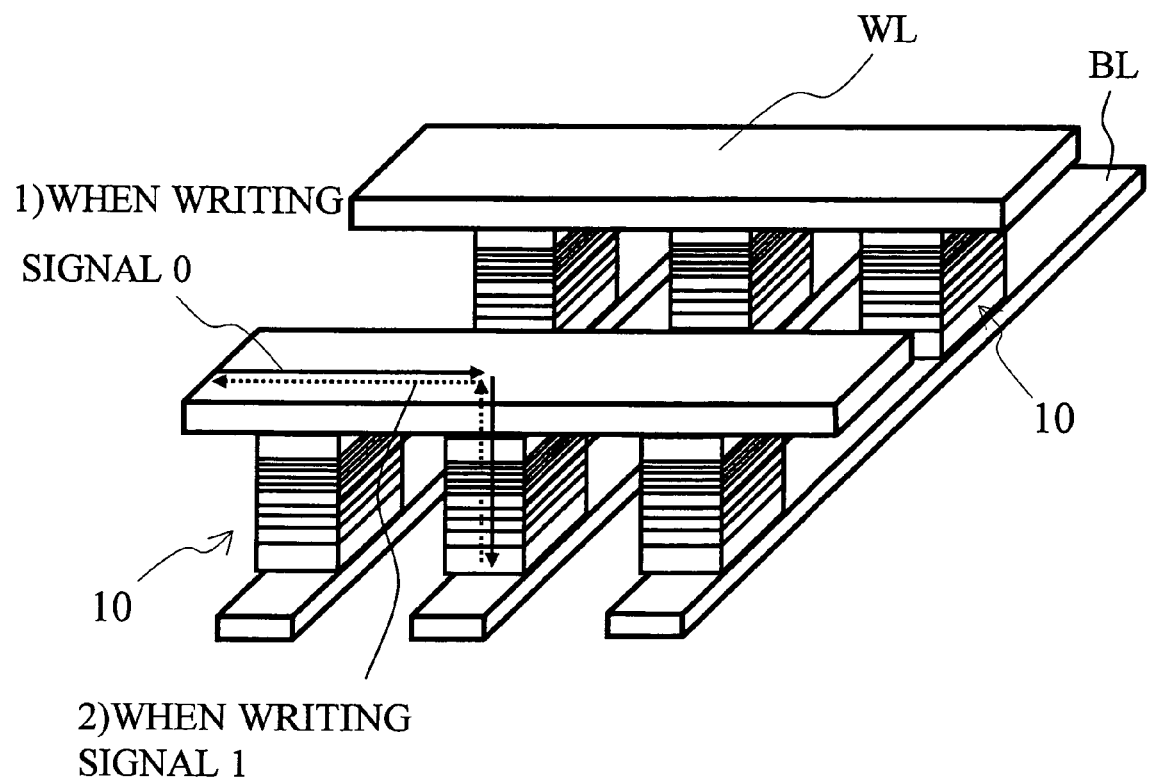
FIG. 32 is a schematic perspective view illustrating the structure of a magnetic memory of the example of the invention.

FIG. 32 is a schematic perspective view illustrating the structure of a magnetic memory of this example.

More specifically, each of the magnetic devices 10 is provided between a word line WL and a bit line BL wired in a matrix configuration. Writing to the magnetic device 10 can be carried out, as with Example 5, by passing write current Iw through the magnetic device 10 and assigning signal "0" or "1" depending on its polarity. Reproduction can be carried out by passing reproduction current Is and detecting magnetoresistance effect. The cross-point magnetic memory is one of the structures that enable the highest level of integration.

EXAMPLE 7

In a seventh example of the invention to be described, the magnetic memory is of a probe storage type.

Figure 33:
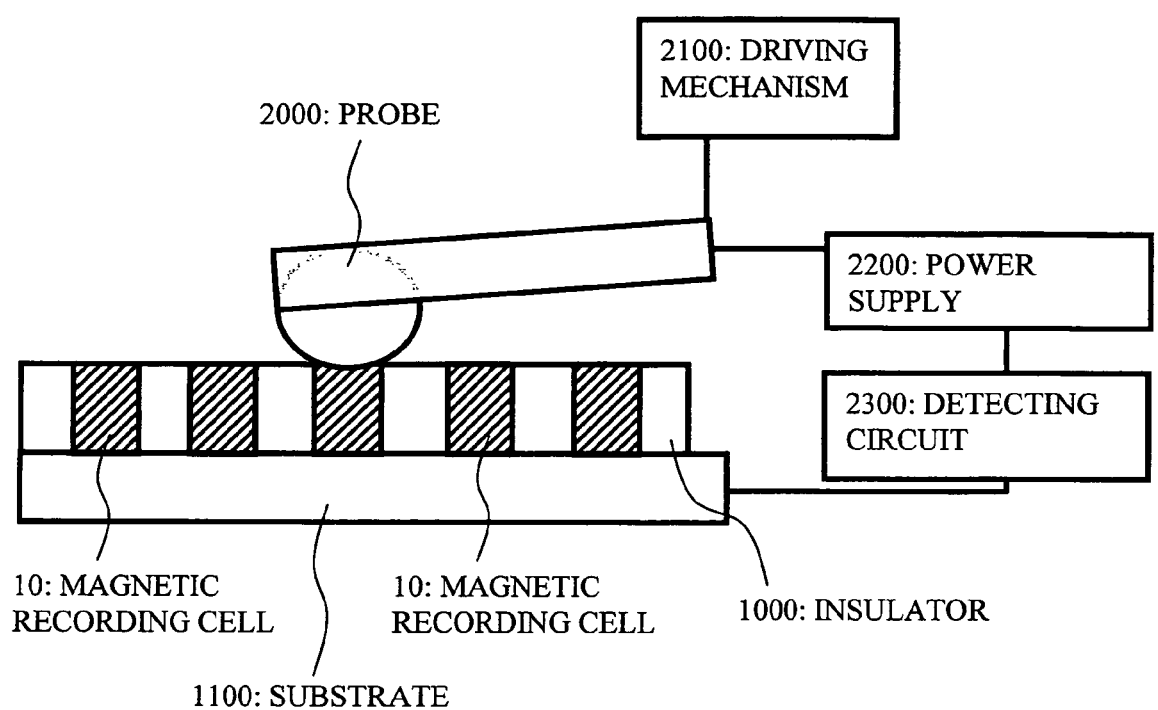
FIG. 33 is a schematic view showing a magnetic memory that uses a magnetic device of the invention.

FIG. 33 is a schematic view showing a magnetic memory that uses a magnetic device of the invention. More specifically, the present specific example is a probe storage where the magnetic device of the present invention is applied to the so-called "patterned medium" which is accessed via a probe.

The recording medium is configured such that the magnetic devices 10 of the present invention are arranged in the plane of high-resistance insulator 1000 in a matrix configuration on a conductive substrate 1100. To select the magnetic device, a probe 2000 is provided over the surface of the medium. Also provided are a driving mechanism 2100 for controlling the relative positional relationship between the probe 2000 and the surface of the medium, a power supply 2200 for applying current or voltage from the probe 2000 to the magnetic device 10, and a detecting circuit 2300 for detecting the internal magnetization state of the magnetic device 10 as a variation of electric resistance.

In the specific example shown in FIG. 33, the driving mechanism 2100 is connected to the probe 2000. However, the driving mechanism 2100 may be provided on the medium side as long as the position of the medium varies relative to the probe. As shown in FIG. 33, a plurality of magnetic devices 10 of the present invention are arranged on the conductive substrate 1100 to form a patterned medium. Recording and reproduction are carried out by passing current between the conductive probe 2000 and the substrate 1100 via the magnetic devices 10.

Selection of magnetic devices 10 is carried out by varying the relative positional relationship between the conductive probe 2000 and the patterned medium. The conductive probe 2000 only needs to be electrically connected with the magnetic devices 10, whether in a contact or noncontact manner. In a noncontact situation, recording and reproduction can be carried out by means of tunneling current or field-emission current flowing between the magnetic device 10 and the probe 2000.

Recording to the magnetic device 10 is carried out by means of current flowing to the magnetic device 10 from the probe 2000 accessing it, or by means of current flowing from the magnetic device 10 to the probe 2000. Suppose that Ic denotes the reversal current for magnetization M2 of the free layer 400, which is determined by size, structure, composition etc. of the magnetic device 10. Recording can be carried out by passing write current Iw through the magnetic device that is higher than Ic. The recorded magnetization direction is the same as described above with reference to FIGS. 2A to 5B. In this way, passing a spin-polarized electron current through the free layer 400 allows "0" or "1" to be appropriately written.

Reproduction is carried out, as with recording, by means of current flowing from the probe 2000 accessing the magnetic device 10, or by means of current flowing to the probe. However, at the time of reproduction, a reproduction current Is lower than the magnetization reversal current Ic is passed. The recording state of the magnetic recording layer A is determined by detecting voltage or resistance. Consequently, in the magnetic memory of the present specific example, recording and reproduction is achieved by passing current having the relation Iw>Is.

EXAMPLE 8

In a eighth example of the invention to be described, the magnetic memory has a probe array structure in which the probes of Example 7 are multiplexed.

Figure 34:
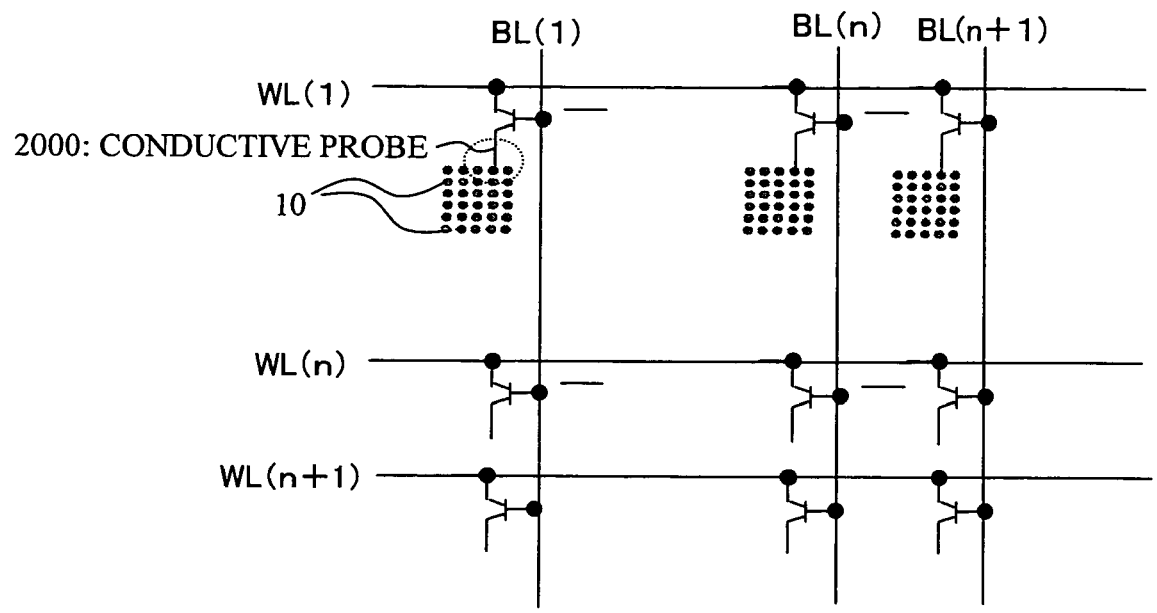
FIG. 34 is a schematic view illustrating the configuration of a magnetic memory of the example of the invention.

FIG. 34 is a schematic view illustrating the configuration of a magnetic memory of this example.

More specifically, the magnetic devices of the present invention were arranged on a substrate as with Example 7 to form a 32×32 matrix. This matrix was in turn repeated 32×32 times to form a recording/reproduction medium having a total of 1 Mbits (megabits). A magnetic memory was then manufactured that carries out recording and reproduction for this recording/reproduction medium with 32×32 probes 2000. In other words, in the magnetic memory of the present example, one probe was assigned to one matrix set.

Probing is as shown in FIG. 34. Selection of cells for each probe 2000 was carried out with an X-Y driving mechanism provided on the medium. However, cell selection may be carried out with the driving mechanism 2100 provided on the probe 2000 as long as the positional relationship is relatively varied. In view of the multiplexing of probes 2000, selection of each probe 2000 was achieved by connecting the probe to a word line WL and a bit line BL and specifying the word line WL and bit line BL.

Recording/reproduction for the magnetic device 10 was carried out by means of current injected from the probe 2000 accessing the magnetic device. At the time of reproduction, reproduction current Is lower than the magnetization reversal current Ic is passed. The recording state of the free layer 400 is determined by detecting voltage or resistance, to which "0" or "1" is assigned.

EXAMPLE 9

In a ninth example of the invention to be described, a magnetic device having a following structure is fabricated. In the structure, a stacked film in which adjacent ferromagnetic layers are ferromagnetically coupled through the Ru nonmagnetic layers is provided between the first pinned layer and the second pinned layer as the free layer, and the first intermediate layer between the first pinned layer and the free layer, the second intermediate layer between the second pinned layer and the free layer are provided First, a sandwiched structure of CoFe/Ru/CoFe in which a thickness of Ru layer is between 0.1 nm and 1.6 nm was fabricated. In order to obtain a range of the Ru layer thickness in which magnetic layers are ferromagnetically coupled, the magnetization curve of the sandwiched structure was investigated.

As a result, it turned out that when the thickness of Ru layer is 0.3 nm or less, the magnetic layers are ferromagnetically coupled with sufficient strength keeping their magnetizations in the film planes. It also turned out that when the thickness of Ru layer is 0.4 nm or more, the magnetic layers are 90° coupled or antiferromagnetically coupled. Further, It also turned out that when the thickness of Ru layer is 1 nm, the antiferromagnetic coupling reached a peak.

On these results, the magnetic devices according to the example of the invention (samples A1 through A6) having following structures were fabricated. In the structure, the free layer inserted the Ru layers of the thickness between 0.1 nm through 0.3 nm was provided between the first pinned layer and the second pinned layer, the first intermediate layer was provided between the first pinned layer and the free layer, and the second intermediate layer was provided between the second pinned layer and the free layer. The sizes of the devices were 70 nm×110 nm.

For comparison, other devices (comparative samples C1 through C6) with the free layers not inserted the Ru layers, which has the same sizes as the above devices were fabricated. Each structure of the samples were as follows.

Sample A1

($Co_9Fe_1$ 4 nm/Ru1 nm/$Co_9Fe_1$ 5 nm)/Cu3.5 nm/($Co_9Fe_1$ 1 nm/Ru0.1 nm/$Co_9Fe_1$ 1 nm/Ru0.1 nm/$Co_9Fe_1$ 1 nm)/$Al_2O_3$ 0.6 nm/$Co_9Fe_1$ 20 nm

Sample A2

($Co_9Fe_1$ 4 nm/Ru1 nm/$Co_9Fe_1$ 4 nm)/Cu6 nm/(CoFeNi1.5 nm/Ru0.2 nm/CoFe Ni1.5 nm)/MgO0.7 nm/Fe10 nm

Sample A3

($Co_8Fe_2$ 3.5 nm/Ru1 nm/$Co_8Fe_2$ 4 nm)/Cu7 nm/($Co_8Fe_2$ 1.2 nm/Ru0.2 nm/$Co_8Fe_2$ 1.3 nm)/$Al_2O_3$ 0.6 nm/$Fe_3O_4$ 30 nm

Sample A4

($Co_9Fe_1$ 4 nm/Ru1 nm/$Co_9Fe_1$ 4.5 nm)/Cu6 nm/($Co_5Fe_5$ 1.25 nm/Ru0.3 nm/$Co_5Fe_5$ 1.25 nm)/$Al_2O_3$ 0.6 nm/$Co_9Fe_1$ 15 nm

Sample A5

(CoFeNi2 nm/Ru1 nm/CoFeNi1 nm/Cu0.2 nm/CoFeNi1 nm)/$Al_2O_3$ 0.6 nm/($Co_9Fe_1$ 1.4 nm/Ru0.2 nm/NiFe1.9 nm)/Cu6 nm/CoFeNi20 nm

Sample A6

($Co_9Fe_1$4 nm/Ru1 nm/$Co_9Fe_1$1 nm/Cu0.2 nm/$Co_9Fe_1$1 nm/Cu0.2 nm/$Co_9Fe_1$1 nm)/Cu4 nm/($Co_9Fe_1$1.25 nm/Ru0.1 nm/$Co_9Fe_1$1.25 nm)/MgO0.8 nm/(Fe15 nm/Au0.4 nm/Fe15 nm)

Comparative Sample C1

($Co_9Fe_1$4 nm/Ru1 nm/$Co_9Fe_1$5 nm)/Cu3.5 nm/$Co_9Fe_1$3 nm/$Al_2O_3$0.6 nm/$Co_9Fe_1$20 nm (Comparative Sample C2)

($Co_8Fe_1$4 nm/Ru1 nm/$Co_9Fe_1$4 nm)/Cu6 nm/CoFeNi3 nm/MgO0.7 nm/Fe10 nm

Comparative Sample C3

($Co_8Fe_2$3.5 nm/Ru1 nm/$Co_8Fe_2$4 nm)/Cu7 nm/$Co_8Fe_2$2.5 nm/$Al_2O_3$0.6 nm/$Fe_3O_4$30 nm

Comparative Sample C4

($Co_9Fe_1$4 nm/Ru1 nm/$Co_9Fe_1$4.5 nm)/Cu6 nm/$Co_5Fe_5$2.5 nm/$Al_2O_3$0.6 nm/$Co_9Fe_1$15 nm

Comparative Sample C5

(CoFeNi2 nm/Ru1 nm/CoFeNi1 nm/Cu0.2 nm/CoFeNi1 nm)/$Al_2O_3$0.6 nm/($Co_9Fe_1$1.4 nm/NiFe1.9 nm)/Cu6 nm/CoFeNi20 nm

Comparative Sample C6

($Co_9Fe_1$4 nm/Ru1 nm/$Co_9Fe_1$1 nm/Cu0.2 nm/$Co_9Fe_1$1 nm/Cu0.2 nm/$Co_9Fe_1$1 nm)/Cu4 nm/$Co_9Fe_1$2.5 nm/MgO0.8 nm/(Fe15 nm/Au0.4 nm/Fe15 nm)

In all samples, the magnetizations of the first pinned layers and the second pinned layers were fixed with exchange bias by antiferromagnetic layers of PtMn or PtIrMn provided adjacent to most outer layers of each layer. The inversion current in current-driven magnetization reversal is obtained by applying current to each sample and measuring resistance change.

FIG. 29 is graphical diagram showing the measurement of current dependency of the resistance for Sample A1 and Sample C1, respectively.

Figure 35:
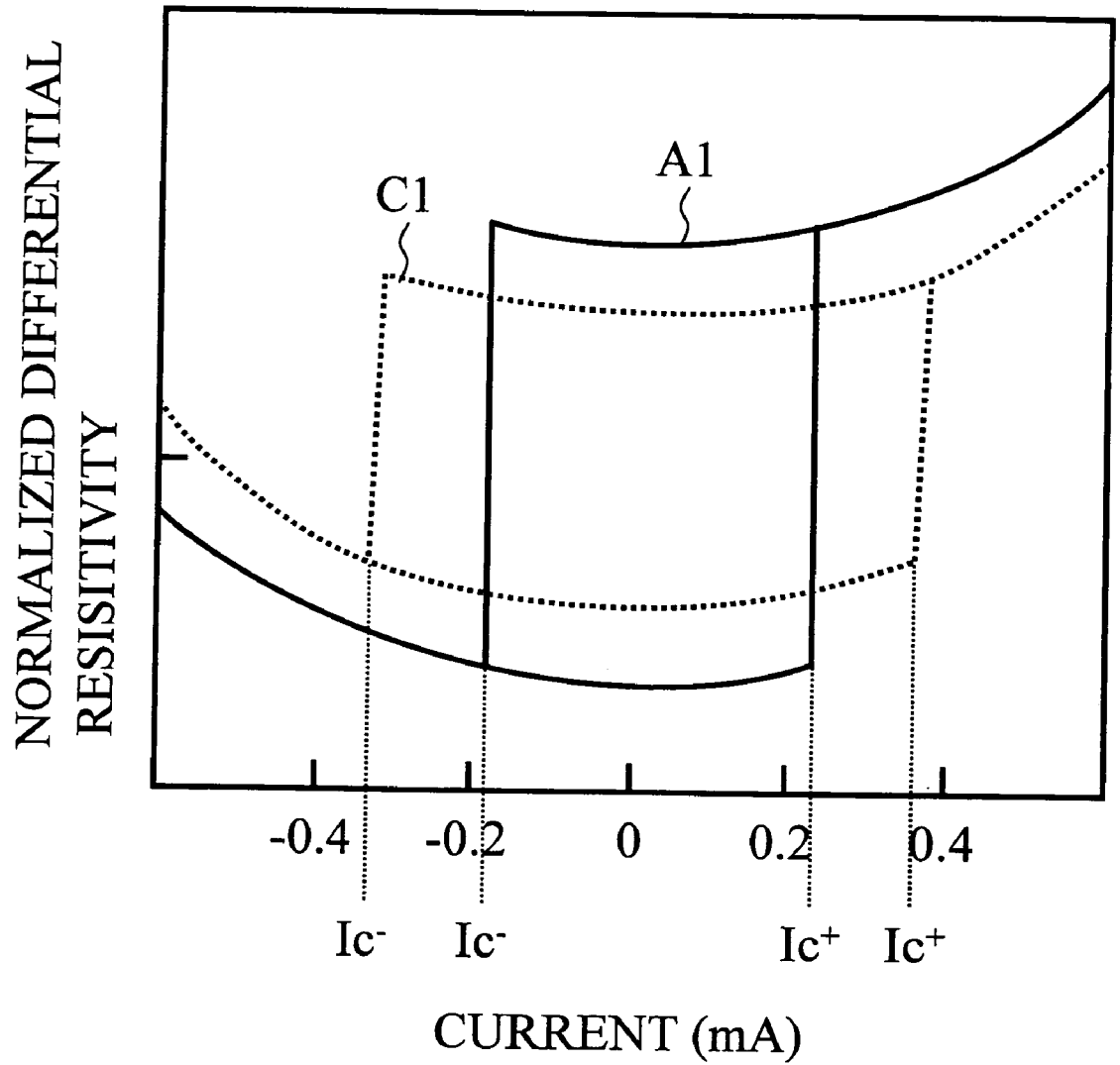
FIG. 35 is graphical diagram showing the measurement of current dependency of the resistance for Sample A1 and Sample C1, respectively.

FIG. 35 shows that when a positive current is applied, the magnetization of the free layer becomes anti-parallel to the magnetization of the below pinned layer at a certain inversion current Ic+. It also shows that when a negative current is applied, the magnetization of the free layer becomes parallel to the magnetization of the below pinned layer at a certain inversion current Ic−.

The average value of the inversion currents of each sample is shown in the TABLE 1. The average value of the inversion currents means an average value of Ic+ and Ic−.

TABLE 1

| Sample number | average value of the inversion currents (mA) | Sample number | average value of the inversion currents (mA) |
| --- | --- | --- | --- |
| A1 | 0.21 | C1 | 0.35 |
| A2 | 0.15 | C2 | 0.26 |
| A3 | 0.31 | C3 | 0.58 |
| A4 | 0.27 | C4 | 0.61 |
| A5 | 0.11 | C5 | 0.23 |
| A6 | 0.23 | C6 | 0.37 |

Table 1 shows that the sample (A series) with the structure according to the example of the invention in which the free layer having the magnetic multilayer film ferromagnetically coupled is provided has lower average inversion current compared with comparative sample (C series). The inversion current can be reduced according to the device of the example of the invention. Furthermore, the device having different size has also the same effect.

EXAMPLE 10

In a tenth example of the invention to be described, a magnetic device in which the first pinned layer and/or the second pinned layer is made into the ferromagnetic layers with a strong ferromagnetic coupling is fabricated. First, a sandwiched structure of CoFe/Cu/CoFe in which a thickness of Cu layer is between 0.1 nm and 1.4 nm was fabricated. In order to obtain the range of the Cu layer thickness in which magnetic layers are ferromagnetically coupled, the magnetization curve of the sandwiched structure was investigated.

As a result, it turned out that when the thickness of Cu layer is 0.7 nm or less, the magnetic layers are ferromagnetically coupled.

The magnetic devices (samples A11-A17) according to the example of the invention, which has the multilayer film ferromagnetically coupled as the first pinned layer (and/or) the second pinned layer, the first pinned layer, the second pinned layer, the free layer between the first pinned layer and the second pinned layer, the first intermediate layer between the first pinned layer and the free layer, and the second intermediate layer between the second pinned layer and the free layer. The sizes of the devices were 70 nm×110 nm.

The comparison devices (comparative samples C11 through C17) with the pinned layers not inserted the Cu layers, which has the same sizes as the above devices were fabricated. Each structure of the devices is as follows.

(Sample A11)

($Co_9Fe_1$4 nm/Ru1 nm/$Co_9Fe_1$5 nm)/Cu5 nm/(NiFe2 nm/$Co_9Fe_1$1 nm)/$Al_2O_3$0.6 nm/($Co_9Fe_1$2 nm/Cu0.2 nm/$Co_9Fe_1$2 nm/Cu0.2 nm/$Co_9Fe_1$2 nm)

(Sample A12)

(CoFeNi2 nm/Cu0.3 nm/CoFeNi2 nm/Ru1 nm/CoFeNi4 nm)/Cu6 nm/CoFeNi2.5 nm/MgO0.7 nm/Fe40 nm (Sample A13)

($Co_8Fe_2$3.5 nm/Ru1 nm/$Co_8Fe_2$4 nm)/Cu7 nm/($Co_8Fe_2$1.2 nm/Ru0.2 nm/$Co_8Fe_2$1.3 nm)/$Al_2O_3$0.6 nm/($Co_8Fe_2$2 nm/Cu0.2 nm/$Co_8Fe_2$2 nm/Cu0.2 nm/$Co_8Fe_2$2 nm)

(Sample A14)

($Co_9Fe_1$2 nm/Cu0.3 nm/$Co_9Fe_1$2 nm/Ru1 nm/$Co_9Fe_1$4.5 nm)/Cu6 nm/($Co_5Fe_5$1.25 nm/Ru0.3 nm/$Co_5Fe_5$1.25 nm)/$Al_2O_3$0.6 nm/$Fe_3O_4$30 nm (Sample A15)

(CoFeNi2 nm/Ru1 nm/CoFeNi1 nm/Cu0.2 nm/CoFeNi1 nm)/$Al_2O_3$0.6 nm/(CoFeNi1.5 nm/$Co_9Fe_1$1.5 nm)/Cu6 nm/(CoFeNi4 nm/Cu0.4 nm/CoFeNi4 nm)

(Sample A16)

($Co_9Fe_1$3 nm/Ru1 nm/$Co_9Fe_1$1 nm/Cu0.5 nm/$Co_9Fe_1$1 nm/Cu0.5 nm/$Co_9Fe_1$1 nm)/Cu6 nm/($Co_9Fe_1$1.25 nm/Ru0.1 nm/$Co_9Fe_1$1.25 nm)/$Al_2O_3$0.6 nm/($Co_9Fe_1$2 nm/Cu0.5 nm)/$Co_9Fe_1$2 nm/Cu0.5 nm/$Co_9Fe_1$2 nm)

(Sample A17)

($Co_9Fe_1$2 nm/Cu0.2 nm/$Co_9Fe_1$2 nm/Cu0.2 nm/$Co_9Fe_1$2 nm)/Cu6 nm/($Co_9Fe_1$1.25 nm/Cu1 nm/$Co_9Fe_1$1.25 nm)/$Al_2O_3$0.6 nm/($Co_9Fe_1$2 nm/Cu0.2 nm)/$Co_9Fe_1$2 nm/Cu0.2 nm/$Co_9Fe_1$2 nm)

(Sample C11)

($Co_9Fe_1$4 nm/Ru1 nm/$Co_9Fe_1$5 nm)/Cu5 nm/(NiFe2 nm/$Co_9Fe_1$1 nm)/$Al_2O_3$0.6 nm/$Co_9Fe_1$6 nm (Sample C12)

(CoFeNi4 nm/Ru1 nm/CoFeNi4 nm)/Cu6 nm/CoFeNi2.5 nm/MgO0.7 nm/Fe40 nm (Sample C13)

($Co_8Fe_2$3.5 nm/Ru1 nm/$Co_8Fe_2$4 nm)/Cu7 nm/($Co_8Fe_2$1.2 nm/Ru0.2 nm/$Co_8Fe_2$1.3 nm)/$Al_2O_3$0.6 nm/$Co_8Fe_2$6 nm (Sample C14)

($Co_9Fe_1$4 nm/Ru1 nm/$Co_9Fe_1$4.5 nm)/Cu(6 nm)/($Co_5Fe_5$1.25 nm/Ru0.3 nm/$Co_5Fe_5$1.25 nm)/$Al_2O_3$0.6 nm/$Fe_3O_4$30 nm (Sample C15)

(CoFeNi2 nm/Ru1 nm/CoFeNi2 nm)/$Al_2O_3$0.6 nm/(CoFeNi1.5 nm/$Co_9Fe_1$1.5 nm)/Cu6 nm/CoFeNi8 nm (Sample C16)

($Co_9Fe_1$3 nm/Ru1 nm/$Co_9Fe_1$3 nm)/Cu6 nm/($Co_9Fe_1$1.25 nm/Ru0.1 nm/$Co_9Fe_1$1.25 nm)/$Al_2O_3$0.6 nm/$Co_9Fe_1$6 nm (Sample C17)

$Co_9Fe_1$6 nm/Cu6 nm/($Co_9Fe_1$1.25 nm/Cu1 nm/$Co_9Fe_1$1.25 nm)/$Al_2O_3$0.6 nm/$Co_9Fe_1$6 nm

In all samples, the magnetizations of the first pinned layer and the second pinned layer were fixed with exchange bias by antiferromagnetic layers of PtMn, PtIrMn or NiO provided adjacent to most outer layers of each layer.

The average of the inversion currents of each sample is shown in TABLE 2.

TABLE 2

| Sample number | average value of the inversion currents (mA) | Sample number | average value of the inversion currents (mA) |
| --- | --- | --- | --- |
| A11 | 0.18 | C11 | 0.27 |
| A12 | 0.26 | C12 | 0.40 |
| A13 | 0.23 | C13 | 0.35 |
| A14 | 0.14 | C14 | 0.19 |
| A15 | 0.22 | C15 | 0.38 |
| A16 | 0.21 | C16 | 0.35 |
| A17 | 1.61 | C17 | 2.14 |

TABLE 2 shows that the sample (A series) with the structure according to the example of the invention in which the pinned layer having the magnetic multilayer film ferromagnetically coupled is provided has lower average of the inversion currents compared with each comparative sample (C series). The inversion current can be reduced according to the device of the example of the invention. Furthermore, the device having different size has also the same effect.

According to the invention, it is made possible to provide a magnetic device in which magnetic materials of a microscopic size can be subject to direct writing with low current density or low current. This can solve the problems of device breakdown, heat generation, power consumption, combination with reproduction and other problems.

In other words, it is possible to provide a magnetic device in which magnetic materials of a microscopic size can be subject to writing magnetization locally with low power consumption. Furthermore, it is possible to provide a magnetic device in which the written magnetization can be read out using magnetoresistance effect. These magnetic devices are extremely small. As a result, the invention is highly effective to higher density and functionality of magnetic devices, and to entire downsizing of devices including magnetic devices, thus contributing much to industrial fields.

Embodiments of the invention have been described with reference to specific examples. However, the invention is not limited to the specific examples described above. For example, each of the elements constituting the magnetic device may have different dimensional relationship, material, number, and other shapes or materials for electrode, passivation, insulation and other structures. They are also encompassed within the scope of the invention as long as one skilled in the art can similarly carry out the invention and achieve similar effects by appropriately selecting them from known arts.

In addition, antiferromagnetic layers, ferromagnetic layers, intermediate layers, insulating layers and other components in the magnetic device may each be formed as a single layer, or as a stacked structure of two or more layers.

The scope of the invention also encompasses all magnetic devices and magnetic memories that one skilled in the art can implement by appropriately modifying the design based on the magnetic devices and magnetic memories described above as embodiments of the invention.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A magnetic device comprising:
a first ferromagnetic layer in which magnetic layers and one or more nonmagnetic layers are alternately stacked, at least one layer of the magnetic layers having magnetization substantially fixed to a first direction, and two or more layers of the magnetic layers being ferromagnetically coupled via the nonmagnetic layers while having easy axes of magnetization parallel to a film plane;
a second ferromagnetic layer having magnetization substantially fixed to a second direction;
a third ferromagnetic layer provided between the first ferromagnetic layer and the second ferromagnetic layer, the third ferromagnetic layer having a variable direction of magnetization;
a first intermediate layer provided between the first ferromagnetic layer and the third ferromagnetic layer;
a second intermediate layer provided between the second ferromagnetic layer and the third ferromagnetic layer; and
a couple of electrodes configured to provide write current between the first and second ferromagnetic layers to cause spin-polarized electrons to act on the third ferromagnetic layer so that the direction of magnetization of the third ferromagnetic layer is determined depending on a direction of the current,
the ferromagnetic coupling having a strength such that a parallel magnetic alignment of the magnetic layers is maintained when the write current is passed.

2. The magnetic device according to claim 1, wherein the strength J of the ferromagnetic coupling satisfies a formula $$J > (hP/2e\alpha) \times (Iw/A) - t\pi Ms^2$$

where Iw/A is a current density of the write current, t is a thickness of one of the magnetic layers, Ms is the magnetization of the one magnetic layer, h is the Planck's constant, P is a spin asymmetry of current, e is an electric charge, and $\alpha$ is a Gilbert damping constant.

3. The magnetic device according to claim 1, wherein the nonmagnetic layers are formed from any one selected from the group consisting of copper (Cu), silver (Ag), gold (Au), ruthenium (Ru), iridium (Ir), rhodium (Rh) and an alloy containing at least one of them, and has a thickness of less than 2 nanometers.

4. The magnetic device according to claim 1, wherein one of the first and the second intermediate layers is made of an insulator or a semiconductor, and other of the first and the second intermediate layers is made of a conductor.

5. The magnetic device according to claim 1, wherein the third ferromagnetic layer includes alternately stacked magnetic and nonmagnetic layers, the magnetic layers being ferromagnetically coupled via the nonmagnetic layers.

6. A magnetic device comprising:
a first ferromagnetic layer having magnetization substantially fixed to a first direction;
a second ferromagnetic layer having magnetization substantially fixed to a second direction;
a third ferromagnetic layer provided between the first ferromagnetic layer and the second ferromagnetic layer in which magnetic layers and one or more nonmagnetic layers are alternately stacked and the magnetic layers are ferromagnetically coupled via the nonmagnetic layers while having easy axes of magnetization parallel to a film plane, the third ferromagnetic layer having a variable direction of magnetization;
a first intermediate layer provided between the first ferromagnetic layer and the third ferromagnetic layer;
a second intermediate layer provided between the second ferromagnetic layer and the third ferromagnetic layer; and
a couple of electrodes configured to provide a current between the first and second ferromagnetic layers to cause spin-polarized electrons to act on the third ferromagnetic layer so that the direction of magnetization of the third ferromagnetic layer is determined depending on a direction of the current,
the ferromagnetic coupling having a strength such that magnetizations of all of the magnetic layers are reversed keeping parallel magnetic direction therebetween when the write current is passed.

7. The magnetic device according to claim 6, wherein the strength J of the ferromagnetic coupling in the third ferromagnetic layer satisfies a formula $$J > (hP/2e\alpha) \times (Iw/A) - t\pi Ms^2$$

where Iw/A is a current density of the write current, t is a thickness of one of the magnetic layers, Ms is the magnetization of the one magnetic layer, h is the Planck's constant, P is a spin asymmetry of current, e is an electric charge, and $\alpha$ is a Gilbert damping constant.

8. The magnetic device according to claim 6, wherein the nonmagnetic layers are formed from any one selected from the group consisting of copper (Cu), silver (Ag), gold (Au), ruthenium (Ru), iridium (Ir), rhodium (Rh) and an alloy containing at least one of them, and has a thickness of less than 2 nanometers.

9. The magnetic device according to claim 6, wherein one of the first and the second intermediate layers is made of an insulator or a semiconductor, and other of the first and the second intermediate layers is made of a conductor.

10. A magnetic device comprising:
a first ferromagnetic layer in which magnetic layers and one or more nonmagnetic layers are alternately stacked, at least one layer of the magnetic layers having magnetization substantially fixed to a first direction, and two or more layers of the magnetic layers being ferromagnetically coupled via the nonmagnetic layers while having easy axes of magnetization parallel to a film plane;
a second ferromagnetic layer in which magnetic layers and one or more nonmagnetic layers are alternately stacked, at least one layer of the magnetic layers having magnetization substantially fixed to a second direction, and two or more layers of the magnetic layers being ferromagnetically coupled via the nonmagnetic layers while having easy axes of magnetization parallel to a film plane;
a third ferromagnetic layer provided between the first ferromagnetic layer and the second ferromagnetic layer, the third ferromagnetic layer having a variable direction of magnetization;
a first intermediate layer provided between the first ferromagnetic layer and the third ferromagnetic layer;
a second intermediate layer provided between the second ferromagnetic layer and the third ferromagnetic layer; and
a couple of electrodes configured to provide write current between the first and second ferromagnetic layers to cause spin-polarized electrons to act on the third ferromagnetic layer so that the direction of magnetization of the third ferromagnetic layer is determined depending on a direction of the current, the ferromagnetic coupling having a strength such that magnetization of at least one of the magnetic layers is not reversed when the write current is passed.

11. The magnetic device according to claim 10, wherein the strength J of the ferromagnetic coupling satisfies a formula $$J > (hP/2e\alpha) \times (Iw/A) - t\pi Ms^2$$

where Iw/A is a current density of the write current, t is a thickness of one of the magnetic layers, Ms is the magnetization of the one magnetic layer, h is the Planck's constant, P is a spin asymmetry of current, e is an electric charge, and $\alpha$ is a Gilbert damping constant.

12. The magnetic device according to claim 10, wherein the nonmagnetic layers are formed from any one selected from the group consisting of copper (Cu), silver (Ag), gold (Au), ruthenium (Ru), iridium (Ir), rhodium (Rh) and an alloy containing at least one of them, and has a thickness of less than 2 nanometers.

13. The magnetic device according to claim 10, wherein one of the first and the second intermediate layers is made of an insulator or a semiconductor, and other of the first and the second intermediate layers is made of a conductor.

14. A magnetic memory comprising a memory cell in which a plurality of magnetic devices are provided in a matrix configuration with an insulator being interposed between the magnetic devices,
each of the magnetic devices having:
a first ferromagnetic layer in which magnetic layers and one or more nonmagnetic layers are alternately stacked, at least one layer of the magnetic layers having magnetization substantially fixed to a first direction, and two or more layers of the magnetic layers being ferromagnetically coupled via the nonmagnetic layers while having easy axes of magnetization parallel to a film plane;
a second ferromagnetic layer having magnetization substantially fixed to a second direction;
a third ferromagnetic layer provided between the first ferromagnetic layer and the second ferromagnetic layer, the third ferromagnetic layer having a variable direction of magnetization;
a first intermediate layer provided between the first ferromagnetic layer and the third ferromagnetic layer;
a second intermediate layer provided between the second ferromagnetic layer and the third ferromagnetic layer; and
a couple of electrodes configured to provide write current between the first and second ferromagnetic layers to cause spin-polarized electrons to act on the third ferromagnetic layer so that the direction of magnetization of the third ferromagnetic layer is determined depending on a direction of the current,
the ferromagnetic coupling having a strength such that a parallel magnetic alignment of the magnetic layers is maintained when the write current is passed.

15. The magnetic memory according to claim 14, wherein each of the magnetic devices on the memory cell is able to be accessed via a probe.

16. The magnetic memory according to claim 14, wherein
a word line and a bit line are connected to each of the magnetic devices on the memory cell, and
information is able to be recorded to or read out from a particular one of the magnetic devices by selecting the word line and the bit line.

17. A magnetic memory comprising a memory cell in which a plurality of magnetic devices are provided in a matrix configuration with an insulator being interposed between the magnetic devices,
each of the magnetic devices having:
a first ferromagnetic layer having magnetization substantially fixed to a first direction;
a second ferromagnetic layer having magnetization substantially fixed to a second direction;
a third ferromagnetic layer provided between the first ferromagnetic layer and the second ferromagnetic layer in which magnetic layers and one or more nonmagnetic layers are alternately stacked and the magnetic layers are ferromagnetically coupled via the nonmagnetic layers while having easy axes of magnetization parallel to a film plane, the third ferromagnetic layer having a variable direction of magnetization;
a first intermediate layer provided between the first ferromagnetic layer and the third ferromagnetic layer;
a second intermediate layer provided between the second ferromagnetic layer and the third ferromagnetic layer; and
a couple of electrodes configured to provide a current between the first and second ferromagnetic layers to cause spin-polarized electrons to act on the third ferromagnetic layer so that the direction of magnetization of the third ferromagnetic layer is determined depending on a direction of the current,
the ferromagnetic coupling having a strength such that magnetizations of all of the magnetic layers are reversed keeping parallel magnetic direction therebetween when the write current is passed.

18. The magnetic memory according to claim 17, wherein each of the magnetic devices on the memory cell is able to be accessed via a probe.

19. The magnetic memory according to claim 17, wherein
a word line and a bit line are connected to each of the magnetic devices on the memory cell, and
information is able to be recorded to or read out from a particular one of the magnetic devices by selecting the word line and the bit line.

* * * * *